(12) United States Patent
Daubert et al.

(10) Patent No.: US 11,366,141 B1
(45) Date of Patent: Jun. 21, 2022

(54) MULTIPATH WIDE BANDWIDTH CURRENT SENSOR

(71) Applicant: Allegro MicroSystems, LLC, Manchester, NH (US)

(72) Inventors: Steven Daubert, Bedford, NH (US); Sina Haji Alizad, Manchester, NH (US); Srujan Shivanakere, Nashua, NH (US); Maxwell McNally, Manchester, NH (US); Alexander Latham, Harvard, MA (US)

(73) Assignee: Allegro MicroSystems, LLC, Manchester, NH (US)

( * ) Notice: Subject to any disclaimer, the term of this patent is extended or adjusted under 35 U.S.C. 154(b) by 1 day.

(21) Appl. No.: 17/160,573

(22) Filed: Jan. 28, 2021

(51) Int. Cl.
*G01R 19/14* (2006.01)
*G01R 19/25* (2006.01)

(52) U.S. Cl.
CPC ............. *G01R 19/14* (2013.01); *G01R 19/25* (2013.01)

(58) Field of Classification Search
None
See application file for complete search history.

(56) References Cited

U.S. PATENT DOCUMENTS

| | | | |
|---|---|---|---|
| 7,598,601 B2 * | 10/2009 | Taylor | .................... H01L 24/37 257/E27.005 |
| 7,768,083 B2 | 8/2010 | Doogue et al. | |
| 8,629,520 B2 | 1/2014 | Doogue et al. | |
| 8,952,471 B2 | 2/2015 | Doogue et al. | |
| 9,082,957 B2 | 7/2015 | Doogue et al. | |
| 9,859,489 B2 | 1/2018 | Doogue et al. | |
| 10,069,063 B2 | 9/2018 | Doogue et al. | |
| 10,145,908 B2 | 12/2018 | David et al. | |
| 10,352,969 B2 | 7/2019 | Milano et al. | |
| 10,670,672 B2 | 6/2020 | David et al. | |
| 10,935,612 B2 | 3/2021 | Belin et al. | |
| 2020/0249286 A1 | 8/2020 | David et al. | |
| 2021/0376227 A1 * | 12/2021 | Latham | ............... G01R 19/0092 |
| 2022/0026469 A1 * | 1/2022 | Schmitt | ............... G01R 33/0017 |

OTHER PUBLICATIONS

U.S. Appl. No. 17/120,395, filed Dec. 14, 2020, Casu et al.
(Continued)

*Primary Examiner* — Daniel C Puentes
(74) *Attorney, Agent, or Firm* — Daly, Crowley, Mofford & Durkee, LLP

(57) ABSTRACT

A current sensor includes a lead frame having a plurality of leads, at least two of which form a current conductor configured to carry a current that generates a magnetic field and a substrate having first and second opposing surfaces, the first surface proximate to said current conductor and the second surface distal from the current conductor. A first magnetic field transducer is disposed on the substrate and a first coil is disposed on the substrate adjacent to the first magnetic field transducer, wherein the first magnetic field transducer and the first coil are positioned on a first side of the current conductor. A second magnetic field transducer is disposed on the substrate and a second coil is disposed on the substrate adjacent to the second magnetic field transducer, wherein the second magnetic field transducer and the second coil are positioned on a second side of the current conductor.

26 Claims, 13 Drawing Sheets

(56) References Cited

OTHER PUBLICATIONS

U.S. Appl. No. 17/097,498, filed Nov. 13, 2020, Casu et al.
U.S. Appl. No. 17/097,533, filed Nov. 13, 2020, Gillet et al.
U.S. Appl. No. 17/082,151, filed Oct. 28, 2020, Drouin.
Allegro Microsystems LLC Datasheet "ACS732 and ACS733, 1 MHz Bandwidth, Galvanically Isolated Current Sensor IC in SOIC-16 Package", 2020, 27 pages.
Funk et al. "A Fully Integrated DC to 75 MHz Current Sensing Circuit with On-Chip Rogowski Coil", IEEE, 2018, 4 pages.
Funk et al. "An Integrated and Galvanically Isolated DC-to-15.3 MHz Hybrid Current Sensor", IEEE, 2019, 4 pages.
Jiang et al. "A Hybrid Multi-Path CMOS Magnetic Sensor With 76 ppm/° C. Sensitivity Drift and Discrete-Time Ripple Reduction Loops", IEEE Journal of Solid-State Circuits, vol. 52, No. 7, Jul. 2017, 9 pages.
Jiang et al. "Multipath Wide-Bandwidth CMOS Magnetic Sensors", IEEE Journal of Solid-State Circuits, vol. 52, No. 1, Jan. 2017, 12 pages.

\* cited by examiner

MULTIPATH WIDE BANDWIDTH CURRENT SENSOR

CROSS-REFERENCE TO RELATED APPLICATIONS

Not Applicable.

STATEMENT REGARDING FEDERALLY SPONSORED RESEARCH

Not Applicable.

FIELD

This disclosure relates generally to current sensors and more particularly to multipath wide bandwidth current sensor integrated circuits (ICs).

BACKGROUND

Some electrical current sensors use one or more magnetic field sensing elements in proximity to a current-carrying conductor to sense a magnetic field generated by the current. The magnetic field sensing elements generate an output signal having a magnitude proportional to the magnetic field induced by the current through the conductor. In some integrated circuit current sensors, the current conductor includes a loop formed by the lead frame.

Current sensors sometimes employ a combination of a magnetic field transducer, such as a Hall effect element, for sensing relatively low frequency content of the current and an inductive pickup coil for sensing higher frequency content of the current in order to thereby sense a broader current bandwidth. However, implementing such current sensors can present technical, cost, and space challenges. For example, in some previous such current sensors, offset compensation associated with an integrator in the coil signal path requires complex matching of poles and zeros and use of large components that require "off-chip" implementation (i.e., outside of the integrated circuit package).

SUMMARY

Described herein are current sensor structures and methods directed towards providing wide bandwidth current sensor integrated circuits (ICs) having a magnetic field transducer path for sensing lower frequencies and an inductive coil path for sensing higher frequencies. Placement of transducer/coil pairs on opposite sides of the current conductor provides stray field immunity and positioning of the transducers within a respective coil maximizes coupling so as to reduce susceptibility to sensing variations due to manufacturing position tolerances. The coils can be provided in a "figure eight" pattern in order to reduce the effect of stray fields on common mode voltage variations. One or more electromagnetic shields reduce the effects of capacitive coupling to the sensing elements, substrate, and circuitry. The low frequency signal path can include an impulse filter to remove impulse disturbances. In the high frequency signal path, offset is compensated with circuitry in a manner that permits on-chip implementation (thereby reducing cost and size disadvantages of some previous current sensor designs) and eliminates the need for complex zero/pole matching (which presents a challenge in some previous current sensor designs). Further, startup performance of the compensation circuitry is optimized using a switched capacitor network or a MOSFET-C circuit.

According to the disclosure, a current sensor includes a lead frame having a plurality of leads, at least two of the plurality of leads forming a current conductor configured to carry a current that generates a magnetic field and a substrate having first and second opposing surfaces, the first surface proximate to said current conductor and the second surface distal from the current conductor. A first magnetic field transducer is disposed on the substrate and a first coil is disposed on the substrate adjacent to the first magnetic field transducer, wherein the first magnetic field transducer and the first coil are positioned on a first side of the current conductor. A second magnetic field transducer is disposed on the substrate and a second coil is disposed on the substrate adjacent to the second magnetic field transducer, wherein the second magnetic field transducer and the second coil are positioned on a second side of the current conductor.

Features may include one or more of the following individually or in combination with other features. The current conductor may be curved and wherein the first side of the current conductor is inside the curve and the second side of the current conductor is outside the curve. The first coil may be disposed concentrically with respect to the first magnetic field transducer and the second coil may be disposed concentrically with respect to the second magnetic field transducer. The first magnetic field transducer and the second magnetic field transducer may be disposed on the first surface of the substrate. The current sensor may further include a shield disposed between the current conductor and the first and second coils, wherein the shield has at least one feature selected to reduce an eddy current induced in the shield. For example, the shield may include at least one slot configured to reduce a path length of a closed loop current path in the shield. The current sensor may further include a second shield disposed between the first and second coils and the second surface of the substrate. In embodiments, the first coil may include third and fourth coils wound in opposite directions with respect to each other and the second coil may include fifth and sixth coils wound in opposite directions with respect to each other.

The first and second magnetic field transducers may each include a Hall effect element. The first magnetic field transducer can generate a first magnetic field signal, the second magnetic field transducer can generate a second magnetic field signal, the first coil can generate a third magnetic field signal and the second coil can generate a fourth magnetic field signal and the current sensor may include a first signal path coupled to receive the first and second magnetic field signals and configured to generate a low frequency signal associated with a low frequency content of the current through the current conductor and a second signal path coupled to receive the third and fourth magnetic field signals and configured to generate a high frequency signal associated with a high frequency content of the current through the current conductor. A summation circuit can be configured to sum the low frequency signal and the high frequency signal to provide a signal indicative of the current through the conductor. The first magnetic field transducer and the second magnetic field transducer may detect the magnetic field in opposite directions and the first coil and the second coil may detect the magnetic field in opposite directions, wherein the low frequency signal is a differential signal generated by subtraction of the second magnetic field signal from the first magnetic field signal and the high frequency signal is a differential signal generated by subtraction of the fourth magnetic field signal from the third magnetic field signal.

The first signal path may include a dV/dt filter responsive to the first and second magnetic field signals and configured to generate an impulse filtered signal. A low pass filter can be coupled to receive the impulse filtered signal and generate the low frequency signal. The dV/dt filter can be a median filter.

The second signal path can include an integrator coupled to receive the third and fourth magnetic field signals and an amplifier with an offset rejection circuit coupled in a feedback relationship between an output and an input of the amplifier. The offset rejection circuit can include a proportional-integral circuit configured to compensate for an offset of the amplifier. The proportional-integral circuit may include an integrator stage having an integrating amplifier with a feedback capacitor and a first input resistor, wherein a time constant of the integrator is established by a capacitance of the feedback capacitor and an effective resistance of the first input resistor and a proportional stage including an amplifier having a second input resistor and a feedback resistor. The first input resistor may include a fixed resistor and a switched capacitor circuit having a plurality of switches and a capacitor. The plurality of switches of the switched capacitor circuit may be controlled during a startup period to decrease the effective resistance of the first input resistor in order to thereby decrease the time constant of the integrator and may be controlled following the startup period to increase the effective resistance of the first input resistor in order to thereby increase the time constant of the integrator. The first input resistor may include a fixed resistor and a MOSFET-C circuit comprising a plurality of MOSFETs and one or more switches coupled in parallel with the plurality of MOSFETs. The one or more switches of the MOSFET-C circuit may be controlled during a startup period to decrease the effective resistance of the first input resistor in order to thereby decrease the time constant of the integrator and may be controlled following the startup period to increase the effective resistance of the first input resistor in order to thereby increase the time constant of the integrator. The current sensor may include an integrated circuit package configured to enclose the substrate and at least a portion of the plurality of leads of the lead frame.

Also described is a current sensor including a lead frame having a plurality of leads, at least two of the plurality of leads forming a current conductor configured to carry a current that generates a magnetic field and a substrate having first and second opposing surfaces, the first surface proximate to said current conductor and the second surface distal from the current conductor. A first magnetic field transducer disposed on the substrate is configured to generate a first magnetic field signal and a first coil is disposed on the substrate concentrically with respect to the first magnetic field transducer and configured to generate a second magnetic field signal. A first signal path coupled to receive the first magnetic field signal is configured to generate a low frequency signal associated with a low frequency content of the current through the current conductor and a second signal path coupled to receive the second magnetic field signal is configured to generate a high frequency signal associated with a high frequency content of the current through the current conductor. A summation circuit is configured to sum the low frequency signal and the high frequency signal to provide a signal indicative of the current through the current conductor.

According to a further aspect of the disclosure, a current sensor includes a lead frame having a plurality of leads, at least two of the plurality of leads forming a current conductor configured to carry a current that generates a magnetic field and a substrate having first and second opposing surfaces, the first surface proximate to said current conductor and the second surface distal from the current conductor. A first magnetic field transducer is disposed on the substrate and a first coil is disposed on the substrate adjacent to the first magnetic field transducer. A second magnetic field transducer is disposed on the substrate and a second coil is disposed on the substrate adjacent to the second magnetic field transducer. The first coil includes third and fourth coils wound in opposite directions with respect to each other and the second coil includes fifth and sixth coils wound in opposite directions with respect to each other.

According to yet another aspect, a current sensor includes a lead frame having a plurality of leads, at least two of the plurality of leads forming a current conductor configured to carry a current that generates a magnetic field and a substrate having first and second opposing surfaces, the first surface proximate to said current conductor and the second surface distal from the current conductor. A first magnetic field transducer disposed on the substrate is configured to generate a first magnetic field signal and a first coil disposed on the substrate is configured to generate a second magnetic field signal. A first signal path coupled to receive the first magnetic field signal is configured to generate a low frequency signal associated with a low frequency content of the current through the current conductor, wherein the first signal path includes a dV/dt filter coupled to receive the first magnetic field signal and configured to generate an impulse filtered signal. A second signal path coupled to receive the second magnetic field signal is configured to generate a high frequency signal associated with a high frequency content of the current through the current conductor. A summation circuit is configured to sum the low frequency signal and the high frequency signal to provide a signal indicative of the current through the current conductor.

Also described is a current sensor integrated circuit including a lead frame having a plurality of leads, at least two of the plurality of leads forming a current conductor configured to carry a current that generates a magnetic field and a substrate having first and second opposing surfaces, the first surface proximate to said current conductor and the second surface distal from the current conductor. A first magnetic field transducer disposed on the substrate is configured to generate a first magnetic field signal and a first coil disposed on the substrate is configured to generate a second magnetic field signal. A first signal path coupled to receive the first magnetic field signal is configured to generate a low frequency signal associated with a low frequency content of the current through the current conductor and a second signal path coupled to receive the second magnetic field signal is configured to generate a high frequency signal associated with a high frequency content of the current through the current conductor. The second signal path includes an integrator coupled to receive the second magnetic field signal and an amplifier having an offset rejection circuit coupled in a feedback relationship between an output and an input of the amplifier, wherein the offset rejection circuit includes a proportional-integral circuit configured to compensate for an offset of the amplifier. The proportional-integral circuit includes an integrator stage having an integrating amplifier with a feedback capacitor and a first input resistor, wherein a time constant of the integrator is established by a capacitance of the feedback capacitor and an effective resistance of the first input resistor. The proportional-integral circuit further includes a proportional stage including an amplifier having a second input resistor and a feedback resistor and a summation circuit configured to sum the low frequency signal and the high frequency signal to provide a signal indicative of the current through the current conductor.

Features may include one or more of the following individually or in combination with other features. The first input resistor may include a fixed resistor and a MOSFET-C circuit comprising a plurality of MOSFETs and one or more switches coupled in parallel with the plurality of MOSFETs. The one or more switches of the MOSFET-C circuit may be controlled during a startup period to decrease the effective resistance of the first input resistor in order to thereby decrease the time constant of the integrator and may be controlled following the startup period to increase the effective resistance of the first input resistor in order to thereby increase the time constant of the integrator.

DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

DETAILED DESCRIPTION

Figure 1:
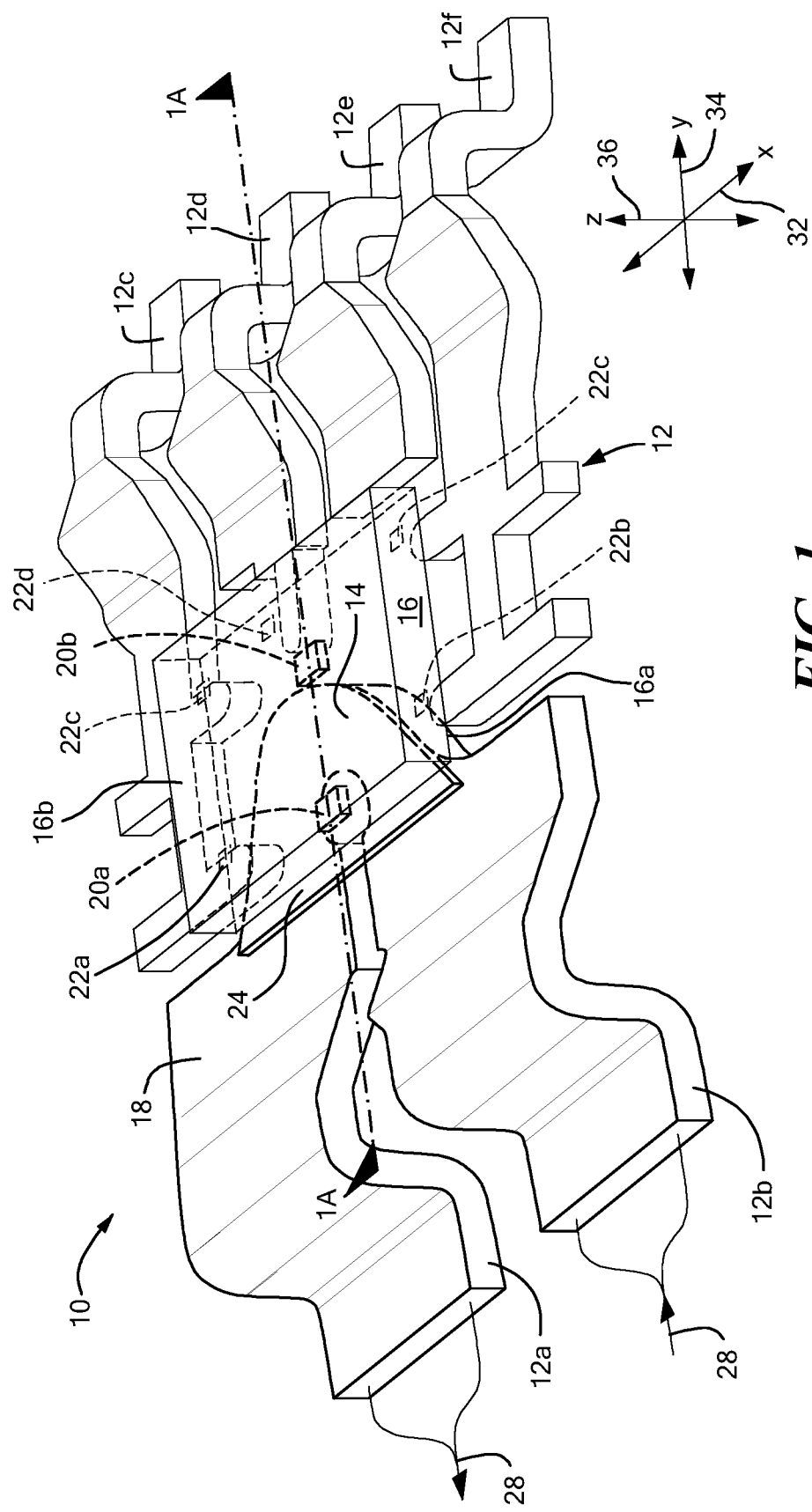
FIG. 1 is an isometric view of a current sensor according to the disclosure.
Figure 1A:
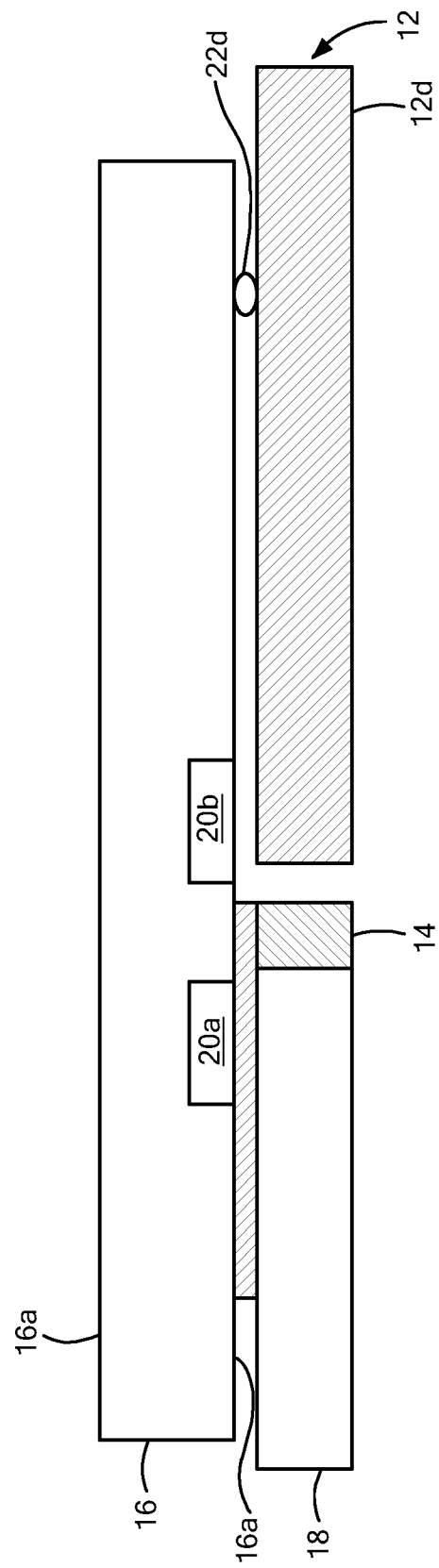
FIG. 1A is a cross-sectional view of the current sensor taken along line 1A-1A of FIG. 1.
Figure 1B:
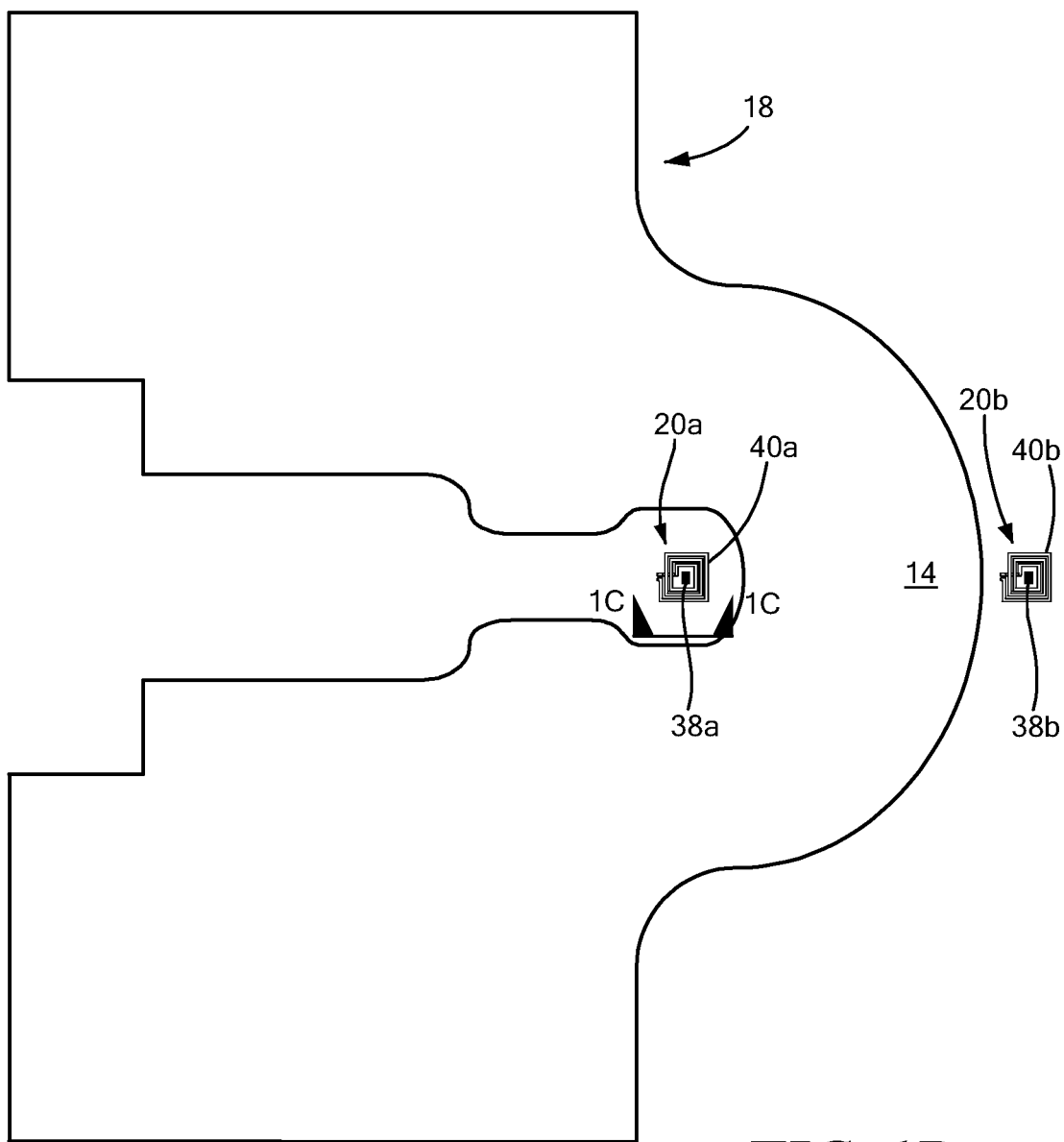
FIG. 1B is a plan view of a portion of the current sensor of FIG. 1.

Referring to FIGS. 1, 1A, and 1B, a current sensor 10 includes a lead frame 12 having a plurality of leads 12a-12f, at least two of which leads 12a, 12b form part of a current conductor 18 configured to carry a current (illustrated by arrow 28) that generates a magnetic field. A substrate 16 has first and second opposing surfaces 16a, 16b, with the first surface 16a proximate to the current conductor 18 and the second surface 16b distal from the current conductor. A first magnetic field transducer and coil pair 20a is disposed on the first surface 16a of the substrate 16 and a second magnetic field transducer and coil pair 20b is also disposed on the first surface 16a of the substrate 16. The substrate 16 is positioned with respect to the lead frame 12 such that the first transducer and coil pair 20a is positioned on a first side of the current conductor 18 and the second transducer and coil pair 20b is positioned on a second side of the current conductor.

Conductor 18 includes leads 12a, 12b and a narrowed junction portion 14. In the example embodiment of FIG. 1, the conductor portion 14 is curved and thus transducer/coil pair 20a can be described as being positioned "inside" the curve and transducer/coil pair 20b can be described as being positioned "outside" the curve. It will be appreciated by those of ordinary skill in the art however, that other shapes and configurations of the conductor 18 including leads 12a, 12b and conductor portion 14 are possible. Furthermore, conductor 18 can include additional leads (not shown) based on application specifications.

In operation, current 28 flows into lead 12b, through conductor portion 14, and out lead 12a, thereby generating a magnetic field that is sensed by the transducer/coil pairs 20a, 20b. Processing of signals from the transducer/coil pairs 20a, 20b is explained below. Suffice it to say here to say that a first signal path coupled to receive magnetic field signals from the magnetic field transducers of the pairs 20a, 20b is configured to generate a low frequency signal associated with a low frequency content of the current 28 and a second signal path coupled to receive magnetic field signals from the coils of the pairs 20a, 20b is configured to generate a high frequency signal associated with a high frequency content of the current. Signals from the first and second paths are combined (e.g., summed) to generate an output signal of the current sensor 10 that is indicative of the current 28 through the conductor 18 and that has a wider frequency bandwidth than possible with use of only magnetic field transducers or only inductive pickup coils. For example, sensor 10 can sense current frequencies from DC to approximately 5 MHz.

As will be explained, placement of the transducer/coil pairs 20a, 20b on opposite sides of the conductor portion 14 and their design by which the pairs sense the magnetic field in opposite directions permit subtraction of their output signals to reject stray magnetic fields. A stray field (i.e., not generated by the current in the lead frame 12) will present the same magnetic field magnitude and polarity to both transducer/coil pairs 20a, 20b. Since the signals from the sensing elements are subtracted to determine the magnetic field generated by the current 28, any signal from a stray field will be removed.

Substrate 16 can be comprised of a semiconductor material such as silicon (in which case substrate 16 can be referred to as a semiconductor die or simply die) or can be comprised of any suitable material for supporting electrical elements and signals, including insulating materials. Solder balls 22a-22e on the substrate surface 16a can couple electrical elements of the current sensor disposed on or otherwise supported by the substrate to lead frame leads 12c-12f (i.e., leads other than the conductor leads 12a, 12b, which leads 12c-12f can be referred to as "signal leads").

While five solder balls 22a-22e are shown, any number of solder balls can be provided, including dummy solder balls for mechanically stabilizing the substrate 16. Also, while solder balls 22a-22e are shown, other connection methods can also be used, including, but not limited to gold bumps, eutectic or high lead solder bumps, no-lead solder bumps, gold stud bumps, polymeric conductive bumps, anisotropic conductive paste, conductive film, or wire bonds. In the case of wire bonds, bond pads can be provided on the substrate and the wire bonds can be electrically connected between the bond pads and signal leads.

In the example embodiment of FIG. 1, the substrate 16 is arranged in a so-called "flip-chip" configuration with the active surface 16a (i.e., the surface supporting the transducer/coil pairs 20a, 20b) proximate to the conductor portion 14. This configuration positions the transducer/coil pairs 20a, 20b in close proximity to the conductor portion 14. It will be appreciated by those of ordinary skill in the art however, that in other embodiments, the substrate 16 can be inverted, or flipped by 180° to provide a so-called "die-up" configuration.

Each transducer/coil pair 20a, 20b includes a magnetic field transducer and a conductive coil configured to sense magnetic field. In an example embodiment, the transducer of each pair 20a, 20b is a planar Hall effect element having a maximum response axis aligned with a z-axis 36. Thus, by positioning the transducer/coil pairs 20a, 20b on either side of the conductor portion 14 (i.e., slightly offset from the conductor portion 14 along the y-axis 34), the magnetic field in the region of the pairs 20a, 20b coincides the maximum response axis of the sensing elements. In the illustrated embodiments, the transducer/coil pairs 20a, 20b are offset (along the y-axis 34) by substantially equal and opposite amounts with respect to the current conductor portion 14. It will be appreciated by those of ordinary skill in the art however, that the transducer/coil pairs 20a, 20b may alternatively be offset (along the y-axis 34) by unequal and opposite amounts with respect to the current conductor portion 14.

It will be appreciated by those of ordinary skill in the art that the magnetic field experienced by the first and the second transducers of the pairs 20a, 20b is oriented in opposite directions. Therefore, the outputs of the transducers of the two pairs 20a, 20b will be opposite in polarity. This configuration can provide advantages of increased sensitivity and immunity to stray magnetic fields.

It will be appreciated that while transducers in the form of Hall effect elements are described in connection with example embodiments, other magnetic field transducers may alternatively or additionally be used. For example, the magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half-bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to the surface of a substrate that supports the magnetic field sensing element, and others of the above-described magnetic field sensing elements tend to have an axis of maximum sensitivity perpendicular to the surface of a substrate that supports the magnetic field sensing element. In particular, planar Hall elements tend to have axes of sensitivity perpendicular to a substrate (i.e., along the z-axis 36), while metal based or metallic magnetoresistance elements (e.g., GMR, TMR, AMR) and vertical Hall elements tend to have axes of sensitivity parallel to a substrate (i.e., along the y-axis 34). Thus, in embodiments employing magnetic field sensing elements other than planar Hall effect elements, positioning the elements with respect to the conductor portion 14 can be tailored to optimize sensitivity.

An insulator 24 is disposed between the substrate 16 from the lead frame 12 to provide electrical isolation between the current conductor 18 and the substrate 16. The insulator 24 can be provided in a variety of ways by a variety of materials. For example, insulating layer 24 can be comprised of tape, such as a polymer Kapton® tape. It will be appreciated by those of ordinary skill in the art that, with respect to the lead frame 12, the insulating layer 24 can extend beyond the substrate 16 in a direction along the y-axis 34 to enhance the resulting electrical isolation.

Referring also to the cross-sectional view of FIG. 1A taken along line 1A-1A of FIG. 1, the flip-chip configuration of current sensor 10 can be seen, in which the transducer/coil pairs 20a, 20b are disposed on the first surface 16a of the substrate 16 proximate to the conductor 18. In particular, transducer/coil pairs 20a, 20b are positioned on either side of conductor portion 14. Also visible in FIG. 1A is the solder bump coupling of the substrate 16 to signal lead (e.g., example solder bump 22d and signal lead 12d).

Referring to the plan view of FIG. 1B, a portion of the current sensor 10 is shown to illustrate the positioning the transducer/coil pairs 20a, 20b relative to the conductor 18. Substrate 16 is omitted from the view of FIG. 1B to facilitate illustration. As shown, each transducer/coil pair 20a, 20b includes a magnetic field transducer (e.g., Hall effect element) 38a, 38b and a coil 40a, 40b, respectively. Each of coils 40a, 40b can be formed by one or more metal traces wound in a generally spiral configuration as shown in the view of FIG. 1B. While the illustrated coils 40a, 40b each have three turns, the number of turns, or loops of each coil can be varied. While generally, more turns are desirable in order to generate a larger signal, the feasible number of turns can be limited by various factors such as chip area, maximum signal, and/or resistance of the coil. Further, while the spiral coil 40a has a generally square shape, it will be appreciated that other shapes are possible.

Each transducer 38a, 38b is positioned concentrically within respect to an innermost loop of the respective coil 40a, 40b, as shown. Positioning of the Hall effect elements 38a, 38b in the center of the respective coils 40a, 40b maximizes coupling in the sense that both the Hall effect elements 38a, 38b and the coils 40a, 40b will experience substantially the same magnetic field and maintains such coupling even over variations in placement of the pairs 20a, 20b relative the conductor portion 14. In other words, even if the transducer/coil pairs 20a, 20b shift along the y-axis with respect to the conductor portion 14 (e.g., even if placement of the die 16 on the lead frame 12 varies due to manufacturing tolerances), both the transducer generated signals and the coil generated signals will be indicative of substantially the same magnetic field and thus, the Hall effect and coil sensing paths will have substantially the same sensitivity. Trim circuitry and techniques can be used to compensate or correct the Hall path and the coil path for shifts in the die placement due to manufacturing tolerances as well as other variations.

Figure 1C:
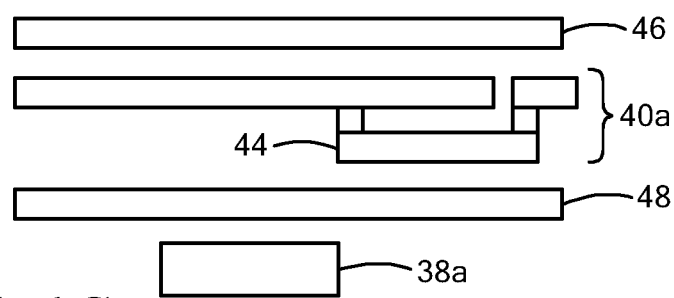
FIG. 1C is a side view of the current sensor portion of FIG. 1B taken along line 1C-1C of FIG. 1B.

Referring also to FIG. 1C, a side view of example transducer/coil pair 20a taken along line 1C-1C of FIG. 1B is shown to include Hall effect element 38a and coil 40a. The side view of FIG. 1C is inverted with respect to the flip-chip configuration view of FIGS. 1, 1A, and 1B. It will be appreciated by those of ordinary skill in the art that the side view of FIG. 1C represents only the portion of the height of the substrate 16 representing the illustrated layers.

For simplicity of explanation, features of the transducer/coil pairs 20a, 20b will be explained with respect to example pair 20a; however, it will be appreciated that transducer/coil pair 20b can be substantially identical to transducer/coil pair 20a. Thus, transducer/coil pair 20b can include a transducer 38b that is the same as or similar to transducer 38a and can include a coil 40b that is the same as or similar to coil 40a.

Transducer/coil pair 20a includes an electromagnetic shield 46 disposed between the current conductor 18 and the first surface 16a of the substrate 16 on which the coils 40a, 40b are disposed in order to prevent unwanted capacitive coupling from the conductor 18 to the sensing elements 38a, 38b, 40a, 40b. A capacitively-coupled signal represents a change in the voltage potential of the lead frame 12. In some applications in which current sensor 10 can be used, such as with motor control or DC/DC converters, this voltage can change rapidly and not in response to a change in the current through conductor 18.

In the side view of FIG. 1C, the shield 46 is shown on a "metal 3" layer that is coupled to a reference potential (i.e., ground) to prevent capacitive coupling from the lead frame 12 to the sensing elements. Since the substrate 16 is packaged in a flip-chip configuration, the conductor 18 is closest to the top level of metal (the metal 3 shield layer 46).

Coil 40a is on "metal 1" and "metal 2" layers, as shown. In order to accommodate electrical connection to both ends of the coil 40a, a cross-under trace 44 is provided on a different metal layer in order to interconnect two portions of the coil 40a, as shown.

In some embodiments, a second shield 48 is provided on the other side of the coil 40a from shield 46 in order to prevent unwanted capacitive coupling from the current conductor 18 of the lead frame 12 into the substrate 16. In such embodiments, in which there is this fourth metal layer, shield 46 is on metal layer 4, coil 40a is on metal layers 2 and 3 and second shield 48 is on metal layer 1.

Figure 3:
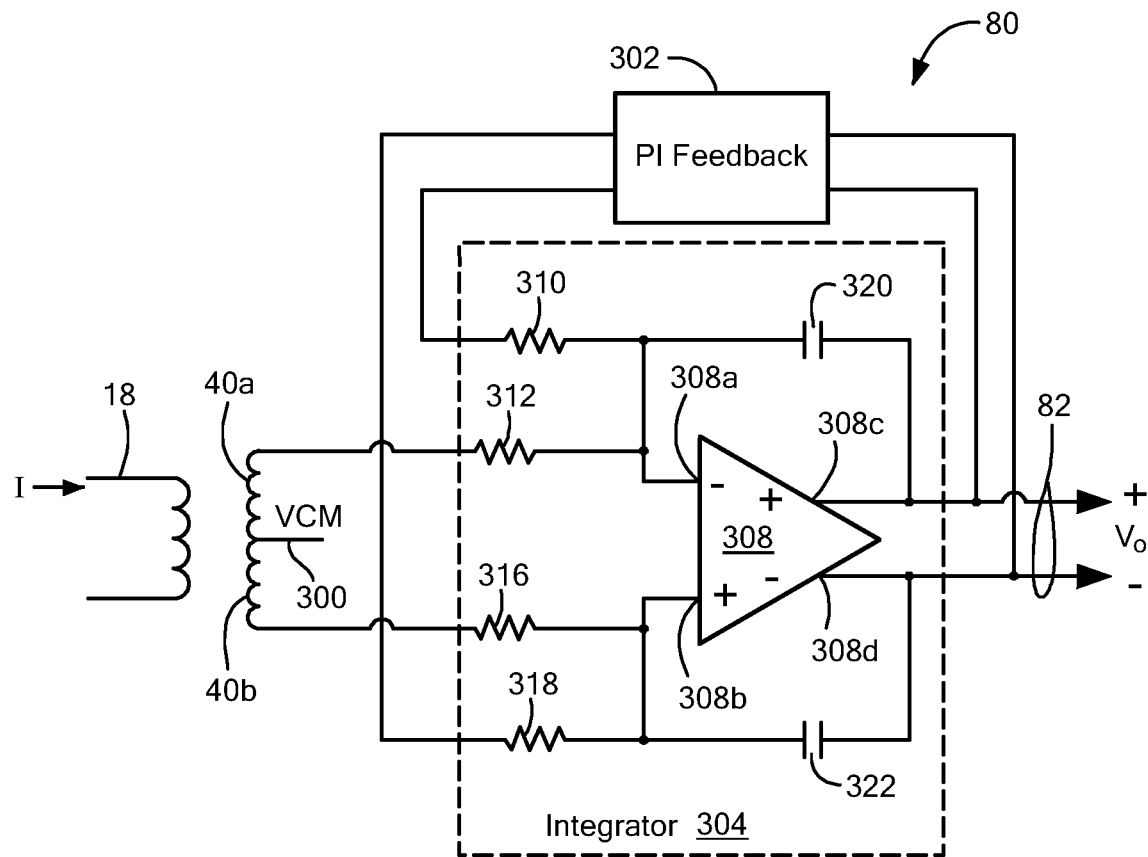
FIG. 3 is a diagram of the integrator and offset rejection block of the current sensor of FIG. 2.

If more levels of metal are available in the process, then multiple layers can be "sandwiched" to create the turns of the coils 40a, 40b. This arrangement advantageously reduces the resistance of the coils. Since the resistance of the coils 40a, 40b is in series with integrator resistors (e.g., as shown in FIG. 3), any change in the metal resistance (as can occur with process and temperature variation), results in an undesired change in the gain of the sensor.

Figure 1D:
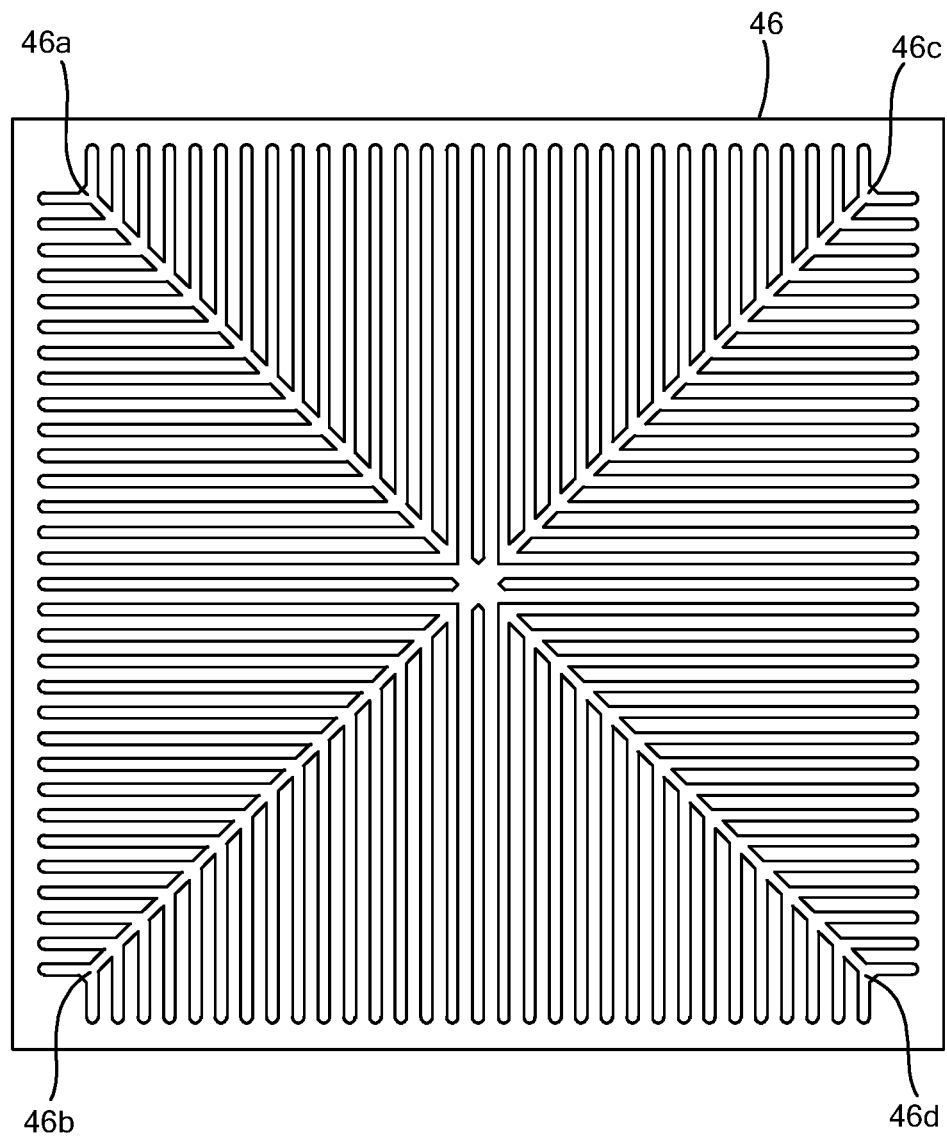
FIG. 1D is a plan view of a shield of the current sensor of FIG. 1.

Referring also to FIG. 1D, electromagnetic shield 46 may take the form of a substantially planar layer and includes at least one feature selected to reduce an eddy current induced in the shield by reducing a path length of a closed loop current path in the shield. Such is desirable since eddy currents would result in a decrease in bandwidth. For example, shield 46 may comprise a metal layer with a generally serpentine pattern arranged in four quadrants with elongated slots 46a-46d between the quadrants. It will be appreciated by those of ordinary skill in the art that other shield designs and eddy current reduction features are possible. Further, it will be appreciated that shield layers 46, 48 can be the same as each other or different.

Figure 1E:
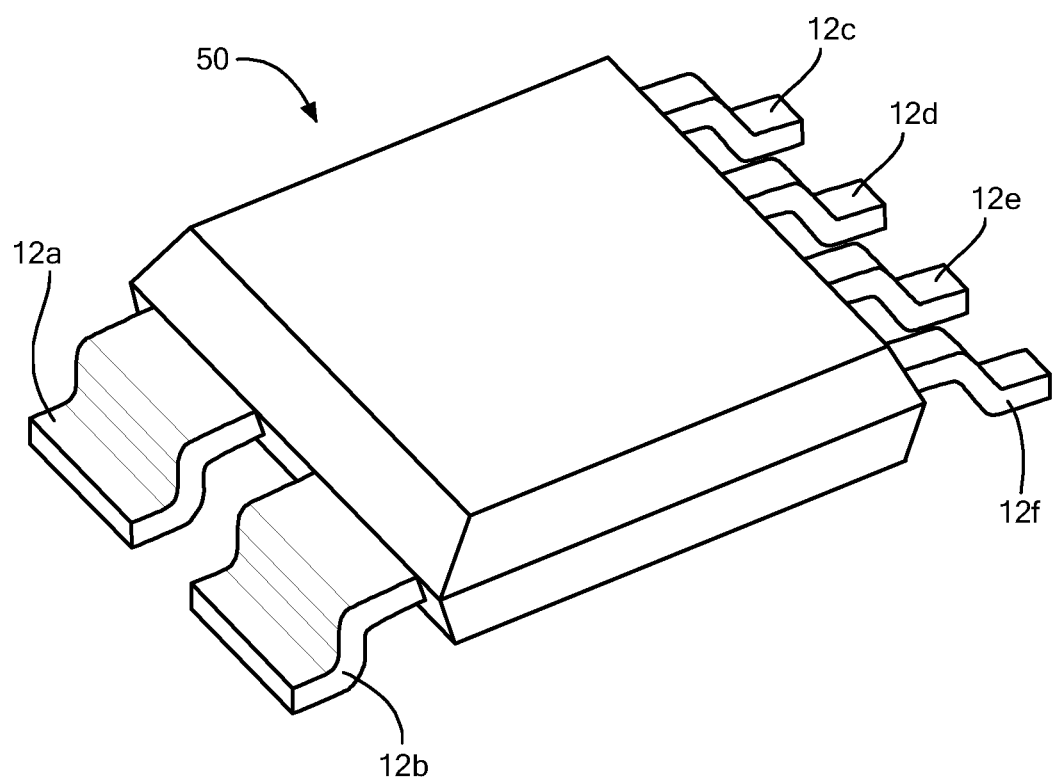
FIG. 1E is an isometric view of the packaged current sensor IC of FIG. 1.

Referring also to FIG. 1E, current sensor 10 can be provided in the form of an integrated circuit (IC) in which the elements of FIG. 1 are over molded with a non-conductive material to form packaged IC 50, as shown. Various molding techniques are possible, including but not limited to injection molding, compression molding, transfer molding, and/or potting, with various materials suitable to electrically isolate and mechanically protect the device. Suitable materials for the mold material include thermoset and thermoplastic mold compounds and other commercially available IC mold compounds.

Leads 12a-12f have ends formed for surface mount attachment to a printed circuit board and/or bus bar or other supporting substrate or structure in use. It will be appreciated by those of ordinary skill in the art however that other attachment structures and techniques are possible for electrically coupling the current sensor 10 to external circuits and systems.

Figure 2:
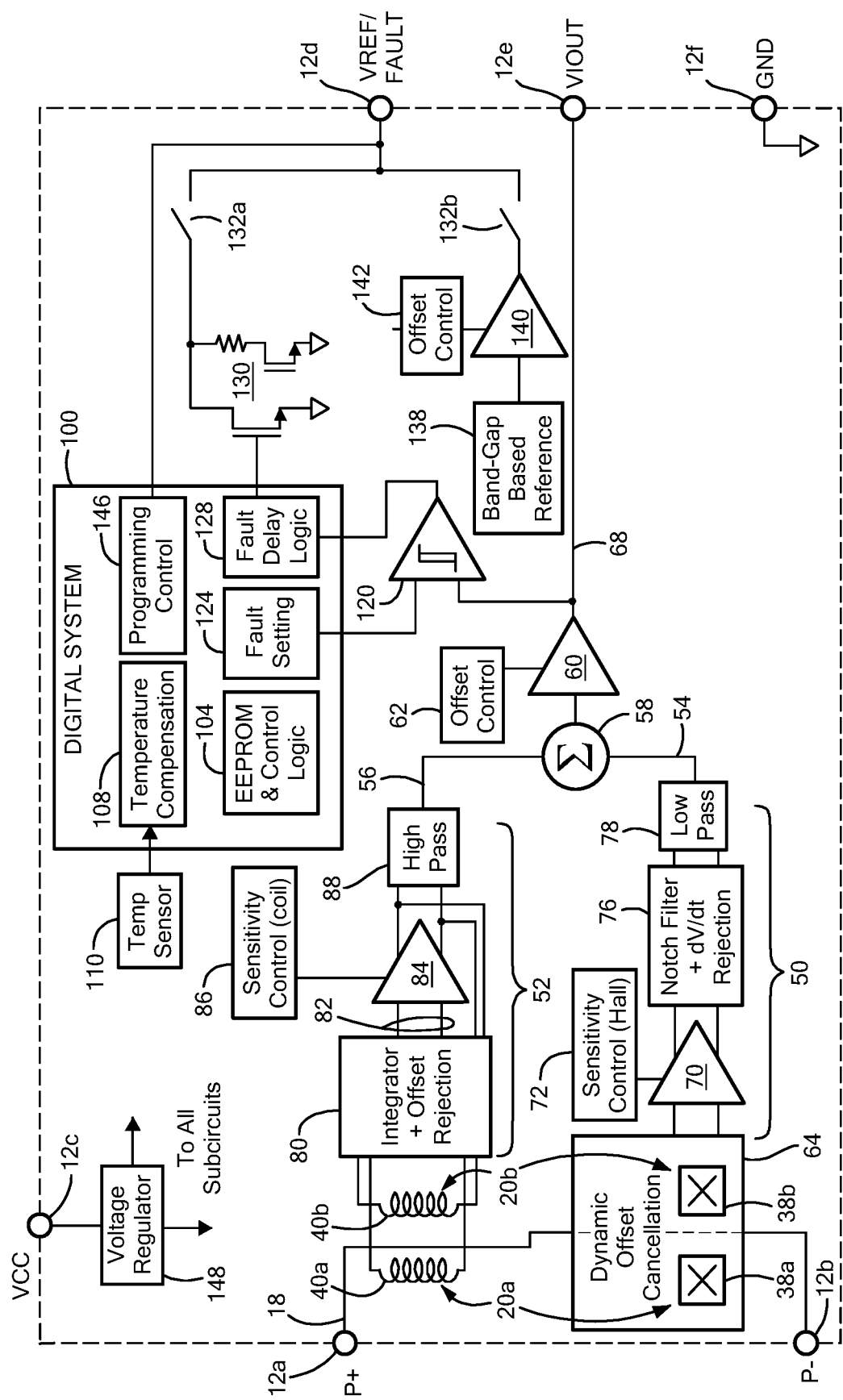
FIG. 2 is a simplified schematic of a current sensor according to the disclosure.

Referring also to FIG. 2, a simplified schematic block diagram of the current sensor 10 is shown to include transducer/coil pairs 20a, 20b, with each pair pictorially shown positioned on opposite sides of current conductor 18. The dotted line box around sensor 10 represents the integrated circuit package 50 (FIG. 1E), with leads 12a-12f illustrated by connection points to/from the IC. It will be appreciated that the signal leads 12c-12f are arbitrarily assigned to the various electrical connections and can be varied and/or more or fewer signal lead and other connections can be provided.

Here again, transducer/coil pair 20a includes Hall effect element 38a and coil 40a and transducer/coil pair 20b includes Hall effect element 38b and coil 40b. Transducer 38a is configured to generate a first magnetic field signal and transducer 38b is configured to generate a second magnetic field signal. Coil 40a is configured to generate a third magnetic field signal and coil 40b is configured to generate a fourth magnetic field signal. Sensor 10 includes a first signal path 50 coupled to receive the magnetic field signals from transducers 38a, 38b and configured to generate a low frequency signal 54 associated with a low frequency content of the current 28 (FIG. 1) through the current conductor 18 and a second signal path 52 coupled to receive the magnetic field signals from coils 40a, 40b and configured to generate a high frequency signal 56 associated with a high frequency content of the current 28 through the current conductor 18. A cross-over network as may include summation circuit 58 is configured to sum the low frequency signal 54 and the high frequency signal 56 to provide a wide bandwidth signal 68 indicative of the current through the conductor 18.

The first and second Hall effect elements 38a, 38b detect the magnetic field generated by the current 28 in opposite directions since the elements are positioned on opposite sides of the conductor portion 14. Similarly, the coils 40a, 40b detect the magnetic field generated by the current 28 in opposite directions since the coils are on opposite sides of the conductor portion 14. Signal path 50 generates the low frequency signal 54 from a differential signal generated by subtraction of the magnetic field signal from transducer 38b from the magnetic field signal from transducer 38a by operation of amplifier 70. Similarly, signal path 52 generates the high frequency signal 56 from a differential signal generated by subtraction of the magnetic field signal from coil 40b from the magnetic field signal from coil 40a by operation of integrator 80. With this arrangement, since stray magnetic fields will influence elements 38a and 38b in the same way and will also influence coils 40a and 40b in the same way, use of differential signals will tend to eliminate the influence of stray magnetic fields.

The low frequency signal path 50 can include dynamic offset cancellation circuitry 64 to remove offset that can be associated with the magnetic field sensing elements 38a, 38b and/or the amplifier 70. Dynamic offset cancellation circuitry 64 may include chopping circuitry with switches configurable to drive the magnetic field sensing elements 38a, 38b in two or more different directions such that selected drive and signal contact pairs are interchanged during each phase of a chopping clock signal and offset voltages of the different driving arrangements tend to cancel.

Front-end amplifier 70 is coupled to receive offset adjusted signals from sensing elements 38a, 38b and can be responsive to a sensitivity control circuit 72 to generate an amplified signal. Sensitivity control circuit 72 can generate and provide a sensitivity control signal to the amplifier 70 to adjust a sensitivity and/or operating voltage of the amplifier.

A notch filter and dV/dt rejection circuit 76 can be coupled to receive the amplified signal and generate an impulse filtered signal. Low pass filter 78 can operate on the impulse filtered signal to generate the low frequency signal 54. Suffice it to say here that since the low frequency signal path has a relatively low bandwidth, an impulse disturbance can take a long time to dissipate. Use of the dV/dt rejection circuit 76 can advantageously remove impulse disturbances that are not eliminated by the shield 46 (FIG. 1D). Details of an example dV/dt filter are discussed below in connection with FIG. 5.

The high frequency signal path 52 can include an integrator and offset rejection circuit 80 coupled to receive the magnetic field signals from coils 40a, 40b. The integrator portion of circuit 80 is configured to maintain a substantially flat frequency response and the offset rejection portion of circuit 80 is configured to prevent saturation of the coil path 52 from offset amplified by the integrator.

Figure 2A:
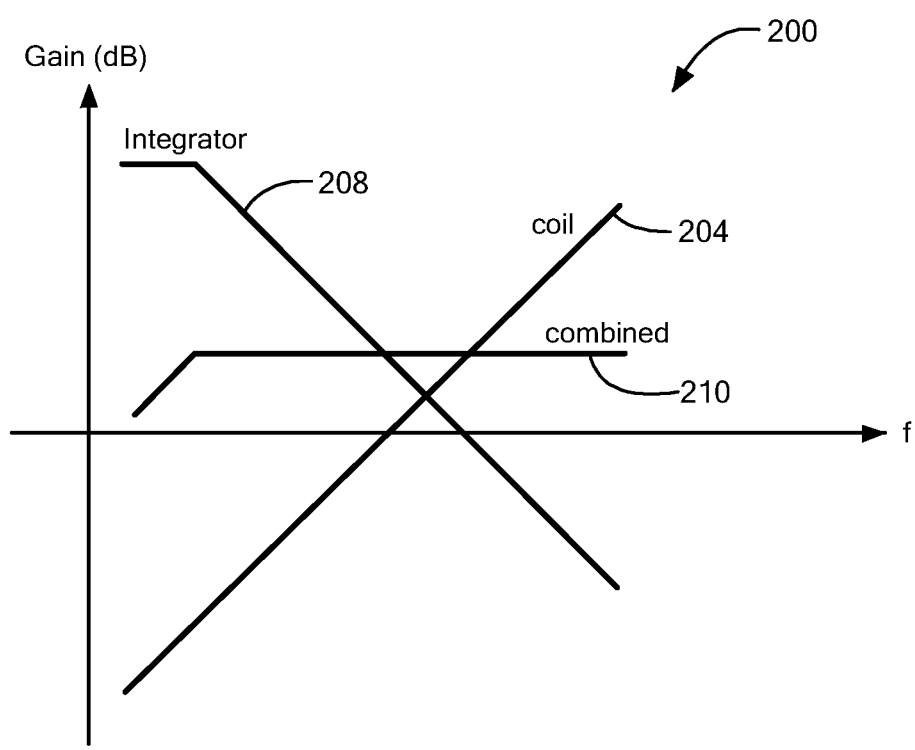
FIG. 2A illustrates coil path gains of the current sensor of FIG. 2.

Referring also to FIG. 2A, a graph 200 illustrates gain associated with the high frequency path 52, with a horizontal axis representing frequency in arbitrary units of Hertz and a vertical axis representing gain in arbitrary units of decibels. Curve 204 illustrates an example gain associated with coils 40a, 40b. Since coils 40a, 40b are inductively coupled to detect the magnetic field generated by the current through conductor 18, the signal strength increases with increasing frequency, as may occur at an example rate of approximately 20 dB/dec.

In order to maintain a substantially flat frequency response, the signals from coils 40a, 40b are passed through an integrator 80. The gain of the integrator 80 is illustrated by curve 208. Integrator 80 is designed to attenuate the signal at the same rate as the coil gain increases over frequency (e.g., at a rate of 20 dB/dec), resulting in a substantially flat gain curve 210 representing combined gain of the coils and integrator.

An amplifier 84 can be coupled to a sensitivity control circuit 86 that can be the same as or similar to sensitivity control circuit 72. A high pass filter 88 can be coupled to receive the amplified signal and configured to generate the high frequency signal 56.

Since integrator 80 provides a high gain at DC, any input offset of the integrator is amplified. In order to prevent the saturation of the coil path 52 from this amplified offset, compensation is implemented by circuit 80 as will be explained further in connection with FIGS. 3-3D.

The output signal of summation circuit 58 can be amplified by an amplifier 60 with further offset control by an offset control circuit 62 in order to generate the current sensor output signal 68 indicative of wide frequency band of current through conductor 18.

Additional components of current sensor 10 can include a digital system 100 containing various signal processing elements, such as an EEPROM and control logic block 104. EEPROM and control logic block 104 determines any application-specific coding and can be erased and reprogrammed using a pulsed voltage. An active temperature compensation circuit 108 can be coupled to acquire temperature data from a temperature sensor 110 and can perform calculations to compensate for changes in temperature.

Current sensor 10 can include fault detection circuitry to detect various faults and provide a FAULT output signal. For example, fault detection circuitry can detect an overcurrent condition and/or an undercurrent condition indicating that the current through conductor 18 is greater than or less than respective thresholds, respectively. To this end, a comparator 120 can be coupled to receive the current sensor output signal 68 and one or more threshold levels from a fault setting block 124. An output of comparator 120 can be coupled to a fault delay logic circuit 128 and provide a FAULT signal at an output (e.g., at signal lead 12d) via one or more drivers 130. Fault delay logic 128 can be used to process the comparator output in various ways. For example, if the comparator output indicates a fault for a very short period of time, the logic 128 can ignore it and not pass a fault signal to pin 12d. Another option is to extend the fault signal in the sense that if the comparator indicates a fault and then disappears, the logic 128 can extend the signal sent to pin 12d, ensuring that the processor monitoring 12d has adequate time to recognize the fault. An output of the current sensor at lead 12d can be a dual-purpose output at which fault detection information or a reference voltage VREF is provided by operation of complementarily controlled switches 132a, 132b. Reference voltage VREF can be provided by a bandgap reference 138 with amplification and offset control provided by elements 140, 142, respectively. A programming control block 146 can be used to control switches 132a, 132b.

A power lead 12c can be coupled to receive a supply voltage VCC for a voltage regulator 148 to generate one or more regulated voltages to power the various components and sub-circuits of the sensor 10. A ground lead 12f can be configured to couple to a reference or ground potential.

While example current sensor 10 has an analog front-end portion and a digital portion, it will be appreciated that the particular delineation of which circuit functions are implemented in an analog fashion or with digital circuitry and signals can be varied. Some of the illustrated circuit functions can be implemented on an integrated circuit sensor 10 and other circuitry and functionality can be implemented on separate circuits (e.g., additional substrates within the same integrated circuit package, or additional integrated circuit packages, and/or on circuit boards).

Referring also to FIG. 3, conductor 18 and coils 40a, 40b are shown coupled to integrator and offset rejection circuit 80, here shown to include integrator 304 and an offset rejection circuit in the form of a Proportional-Integral (PI) feedback circuit 302.

Each coil 40a, 40b has a first terminal coupled to integrator 304 and a second terminal coupled to the other one of the coils at a common mode voltage node VCM 300. Stated differently, of the four coil connections, two go to the common mode voltage node VCM and the remaining two go to the integrator resistors, as shown.

Coils 40a, 40b can be wound in the same direction. With this configuration, in operation, coil output signals from stray magnetic fields will be subtracted out because, even though the coils are positioned on opposite sides of the conductor 18, stray fields will impact both coils in same fashion (in terms of field magnitude and polarity) so that subtraction of one coil signal from the other will negate the impact of the stray field. In this way, placement of the two coils 40a, 40b on different sides of the conductor provides immunity to stray fields.

The magnetic signal generated by the current in conductor 18 can cause a current to flow into the common mode voltage reference VCM 300. If the coupling from lead frame 12 were matched to each coil 40a and 40b, then the amplitude of the coil voltages would match. With matched resistors 312 and 316, each of which are connected to a "virtual VCM" at the inputs to amplifier 308, the current flowing through the coils 40a and 40b and resistor 312 and 316 are equal. In this case, the voltage reference driving VCM does not need to supply any current.

Stray magnetic field will however cause the common mode voltage VCM to vary. However, because there is a mismatch in the coupling from the lead frame 12 to each coil 40a, 40b whereby there is more coupling to the coil 40a positioned on the inside of the conductor curve (FIGS. 1, 1A, and 1B), the inner coil 40a will generate a larger signal than the outer coil 40b. This coupling mismatch results in a common mode signal at the integrator input. While this unwanted common mode signal can be removed by the integrator 304, doing so requires significant power and additional circuitry. Thus, variation of the common mode voltage can complicate common mode rejection requirements for the front-end components of the current sensor 10, particularly in the case of large amplitude and high frequency input current 28 since it requires both the voltage reference driving VCM to supply the mismatch current and the common mode feedback circuitry of the amplifier 308 to supply the mismatch current. An alternative coil winding configuration to minimize the common mode voltage variation is described below in connection with FIG. 4A.

Integrator 304 includes a differential amplifier 308 having an inverting input 308a to which resistors 310, 312 are coupled and a non-inverting input 308b to which resistors 316, 318 are coupled, as shown. Each input 308a, 308b acts as a summing node. Each of differential outputs 308c, 308d of the amplifier 308 is coupled in a feedback relationship to a respective input 308a, 308b by a respective feedback capacitor 320, 322, as shown. The differential output signal 82 of circuit 80 is provided at amplifier outputs 308c, 308d. The example integrator 304 advantageously permits a convenient method for the summation of the feedback signals and input signals from the coils. However, it will be appreciated by those of ordinary skill in the art other integrator implementations, such as a transconductor and load capacitor, are also possible.

The PI circuit 302 is coupled in a feedback relationship with the integrator 304. To this end, PI circuit 302 is coupled to receive differential signal 82 and provide input signals coupled to integrator inputs through resistors 310 and 318, as shown. Although the PI circuit 302 could be implemented either with external or with internal (i.e., "on-chip") components, it can be advantageous to integrate circuit 302 within the sensor IC for cost and space reasons.

Figure 3A:
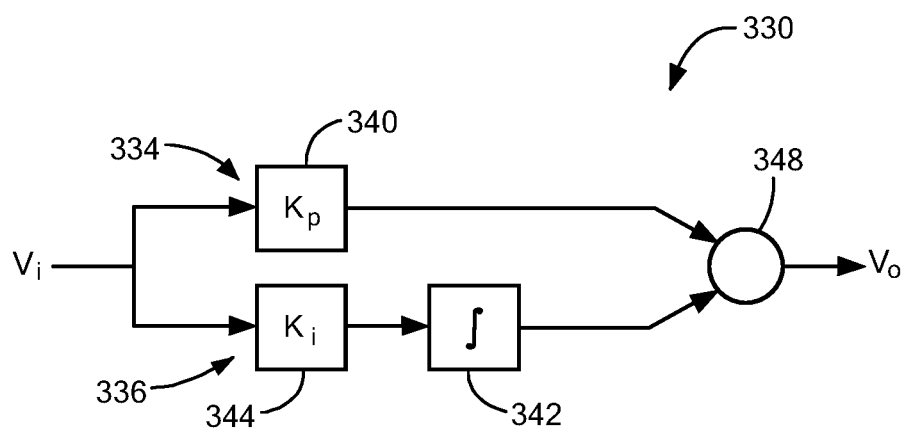
FIG. 3A shows a simplified proportional-integral circuit of the offset rejection block of FIG. 3.

Referring also to FIG. 3A, a simplified PI circuit 330 as may provide the PI circuit 302 of FIG. 3 contains a proportional path 334 and an integral path 336, which paths are combined by a summation element 348. The proportional path 334 can include a proportional gain Kp 340 and the integral path 336 can include an integrating stage 342 and integral constant Ki 344.

Figure 3B:
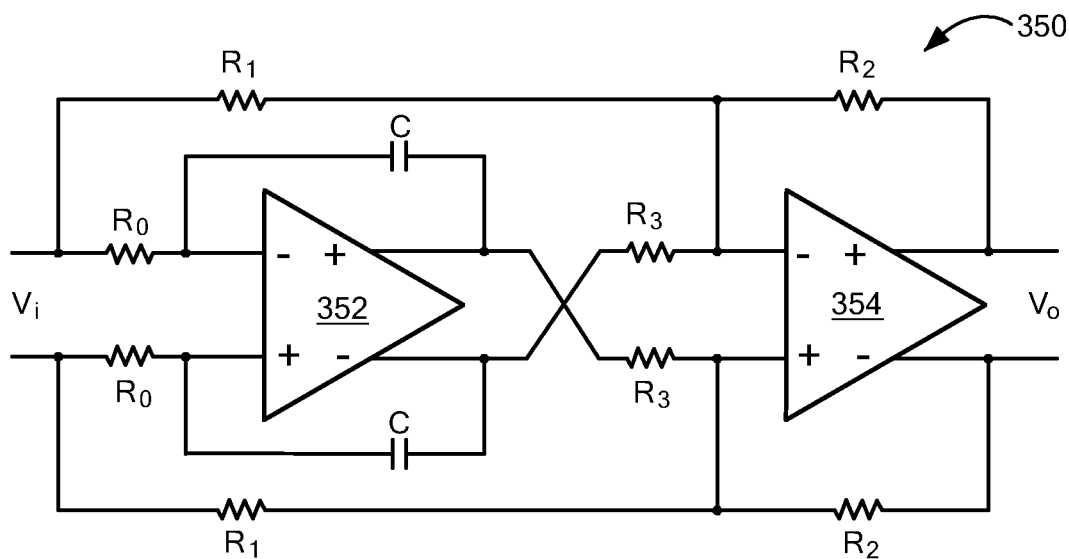
FIG. 3B shows an example proportional-integral circuit of the offset rejection block of FIG. 3.

Referring also to FIG. 3B, an example PI circuit 350 as may provide the PI circuit 302 of FIG. 3 can include an integral stage including an operational amplifier 352 and a proportional stage including an operational amplifier 354. The integral stage includes feedback capacitors C and input resistors $R_0$ coupled to the differential inputs of amplifier 352, as shown. The differential output of amplifier 352 is cross-coupled to inputs of proportional stage amplifier 354 in order to thereby introduce a signal inversion. Proportional amplifier 354 has feedback resistors $R_2$ and input resistors $R_3$ as shown.

The transfer function of the PI circuit 350 can be represented as follows:

$$v_0/v_i(s) = K_p + K_i/s = -[R_2/R_1 + R_2/sCR_0R_3]$$

The PI feedback cancels the integrator amplifier offset by storing charge on capacitors C that creates a voltage (scaled by $R_2/R_3$) that equals the offset. When subtracted at the integrator input, the offset is eliminated.

A time constant of the PI circuit 350 is established by a capacitance of the feedback capacitors C and an effective resistance of the input resistors $R_0$. The two-amplifier network implementing the PI feedback circuit 350 uses the gain to effectively increase the component values, creating similar time constants on-chip without the need for large components that could require off-chip implementation. More particularly, the pole shown in the integrator curve 208 (FIG. 2A) is attributable to the time constant given by $R_2/sCR_0R_3$. This pole needs to be low enough so that it does not alter the frequency response of the high frequency coil path. Implementing this time constant with a single RC would require a value of capacitance that is too large to be implemented on an integrated circuit. By adding the $R_2/R_3$ gain factor, the capacitance value C can be reduced to a size that enables on-chip components to be used.

One drawback to offset removal using the PI circuit 350 is the need for long time constants. The purpose of the PI circuit is to minimize low frequency gain of the coil front end, and it accomplishes this by feeding back low frequency signals to the input where they are subtracted from the incoming signals from the coil. This minimizes the amplitude of amplifier offset at the integrator output, but also minimizes low frequency signals from the coil. To allow the desired high frequency signals from the coil to pass necessitates a long time constant in the PI feedback so that it does respond to those signals. Upon power-up of the sensor 10, this means a relatively long time for the charge to accumulate on capacitors C. This time constant can be adjusted by changing the value of $R_0$.

Figure 3C:
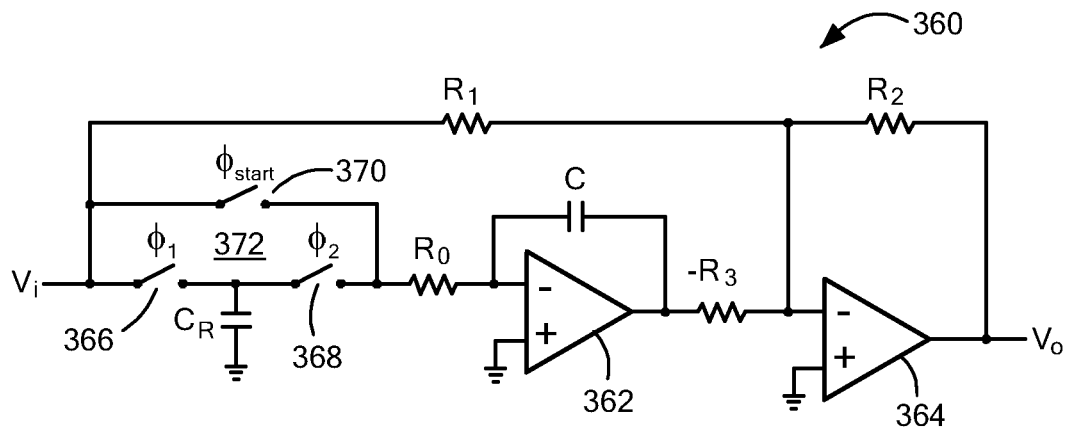
FIG. 3C shows an alternative example proportional-integral circuit of the offset rejection block of FIG. 3.
Figure 3C:
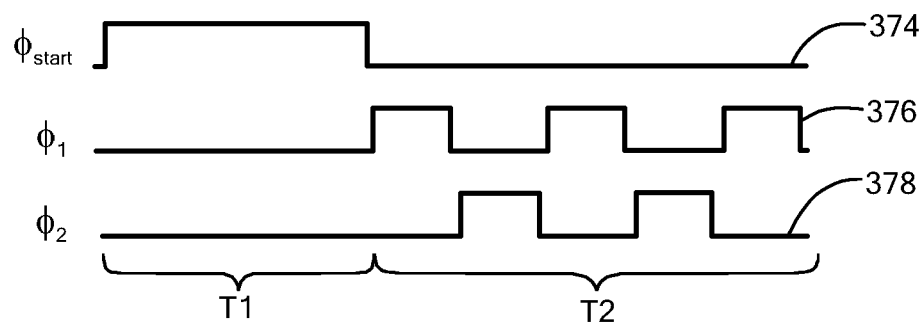

Referring also to FIG. 3C, an alternative PI circuit 360 as may provide the PI circuit 302 of FIG. 3 includes a switched capacitor circuit 372 in series with input resistor $R_0$. To this end, the input resistor $R_0$ of FIG. 3B is replaced in the PI circuit 380 of FIG. 3C by a combination of a fixed resistor $R_0$ and switched capacitor network 372. PI circuit 360 further differs from the PI circuit 350 of FIG. 3B in that it illustrates a single-ended PI circuit implementation with the signal inversion (achieved in FIG. 3B by the cross-coupling of the differential outputs of amplifier 352) illustrated by a negative resistance $-R_3$. It will be appreciated by those of ordinary skill in the art that the single-ended PI circuit 360 could be readily implemented as a differential circuit. In other aspects, PI circuit 360 can be similar to PI circuit 350 and can include an integral stage including an operational amplifier 362 and a feedback capacitor C and a proportional stage including an operational amplifier 364. Proportional amplifier 364 has a feedback resistor $R_2$ and an input resistor $-R_3$, as shown.

Switched capacitor network 372 includes a plurality of switches 366, 368, 370 and a capacitor $C_R$ that operate to change the value of the input resistance to the integrating operational amplifier 362. Switches 366, 368, and 370 are controlled by control signals $\phi_1$ 376, $\phi_2$ 378, and $\phi_{start}$ 374, respectively.

In operation, during a startup period (during a time labeled T1), when it is desired to quickly charge capacitor C, switch 370 is closed by control signal $\phi_{start}$ 374, thereby reducing the time needed to develop an equivalent offset voltage on capacitor C. Following the startup period (during a time labeled T2), when it is desired to have a lower corner frequency through the integrator path, switch 370 is opened by control signal $\phi_{start}$ 374 and switches 366, 368 are selectively opened and closed in a complementary manner by respective control signals 376, 378 in order to thereby increase the effective value of the input resistance to the operational amplifier 362. With this arrangement, the PI circuit 360 has a fast startup, and a better low frequency response during normal operation. Furthermore, PI circuit 360 can be implemented using only on-chip components and does not require zero/pole matching for its operation. The placement of the zero is determined by resistors $R_0$, $R_2$, and $R_3$ and capacitor C and this design is tolerant to movement of the zero with normal process variations for resistors and capacitors.

Figure 3D:
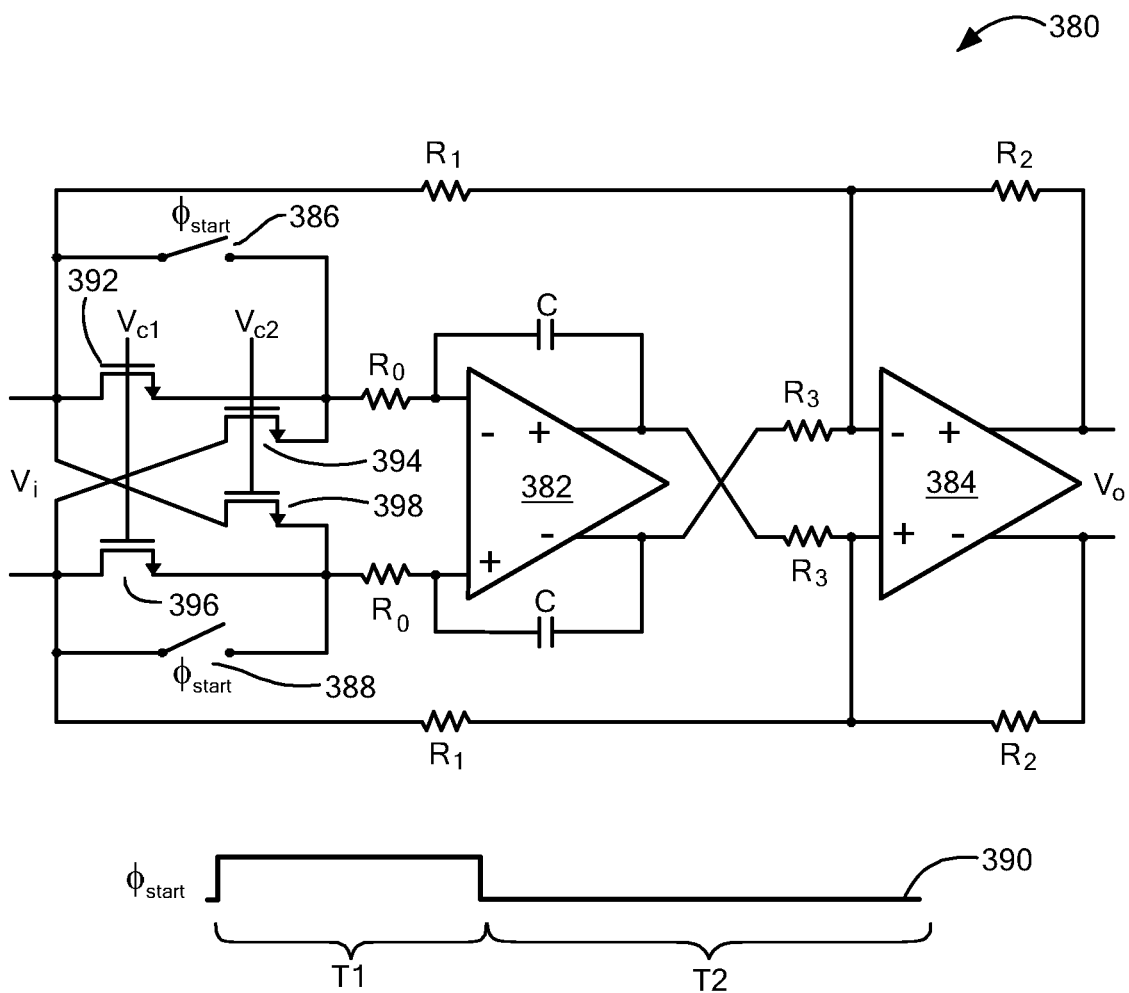
FIG. 3D shows a further alternative example proportional-integral circuit of the offset rejection block of FIG. 3.

Referring also to FIG. 3D, a further alternative PI circuit 380 as may provide the PI circuit 302 of FIG. 3 includes a MOSFET-C approach to providing a fast startup with better low frequency response during normal operation. To this end, the input resistor $R_0$ of FIG. 3B is replaced in the PI circuit 380 of FIG. 3D by a combination of a fixed resistors $R_0$ and MOSFET-C circuitry including FETs 392, 394, 396, 398 and switches 386 and 388 coupled as shown. PI circuit 380 can be a differential circuit as shown and includes an integral stage including an operational amplifier 382 and feedback capacitors C and a proportional stage including an operational amplifier 384. Proportional amplifier 384 has a feedback resistors $R_2$ and input resistors $R_3$, as shown.

FETs 392, 394, 396, 398 and switches 386 and 388 operate to implement a tunable resistance without the need for clock circuitry. Thus, the PI circuit 380 does not require anti-aliasing circuitry or clock signals. FETs 392 and 396 are controlled by a gate voltage $V_{c1}$ and FETs 394, 398 are controlled by a gate voltage $V_{c2}$, which gate voltages can be preset or adjustable in order to achieve a desired effective resistance. Switches 386, 388 are controlled by control signal $\phi_{start}$ 390.

In operation, during a startup period (during a time labeled T1), when it is desired to quickly charge capacitors C and thus, to have a lower effective input resistance to amplifier 382, switches 386, 388 are closed by control signal $\phi_{start}$ 390, thereby effectively shorting FETs 392, 394, 396, and 398. Thus, during the startup period T1, the input resistance to amplifier 382 is based only on the resistance of resistors $R_0$ thereby minimizing the time needed to develop an equivalent offset voltage on capacitors C.

Following the startup period (during a time labeled T2), when it is desired to have a lower corner frequency through the integrator path and thus, a higher effective input resistance to amplifier 382, switches 386, 388 are opened by control signal $\phi_{start}$ 390. In this configuration, the effective input resistance at the inverting input terminal to amplifier 382 is provided by the series combination of resistor $R_0$ with a parallel combination of FETs 392 and 398 and the effective input resistance at the non-inverting input to amplifier 382 is provided by the series combination of resistor $R_0$ with a parallel combination of FETs 394 and 396. With this arrangement, the PI circuit 380 has a fast startup, and a better low frequency response during normal operation.

Figure 4:
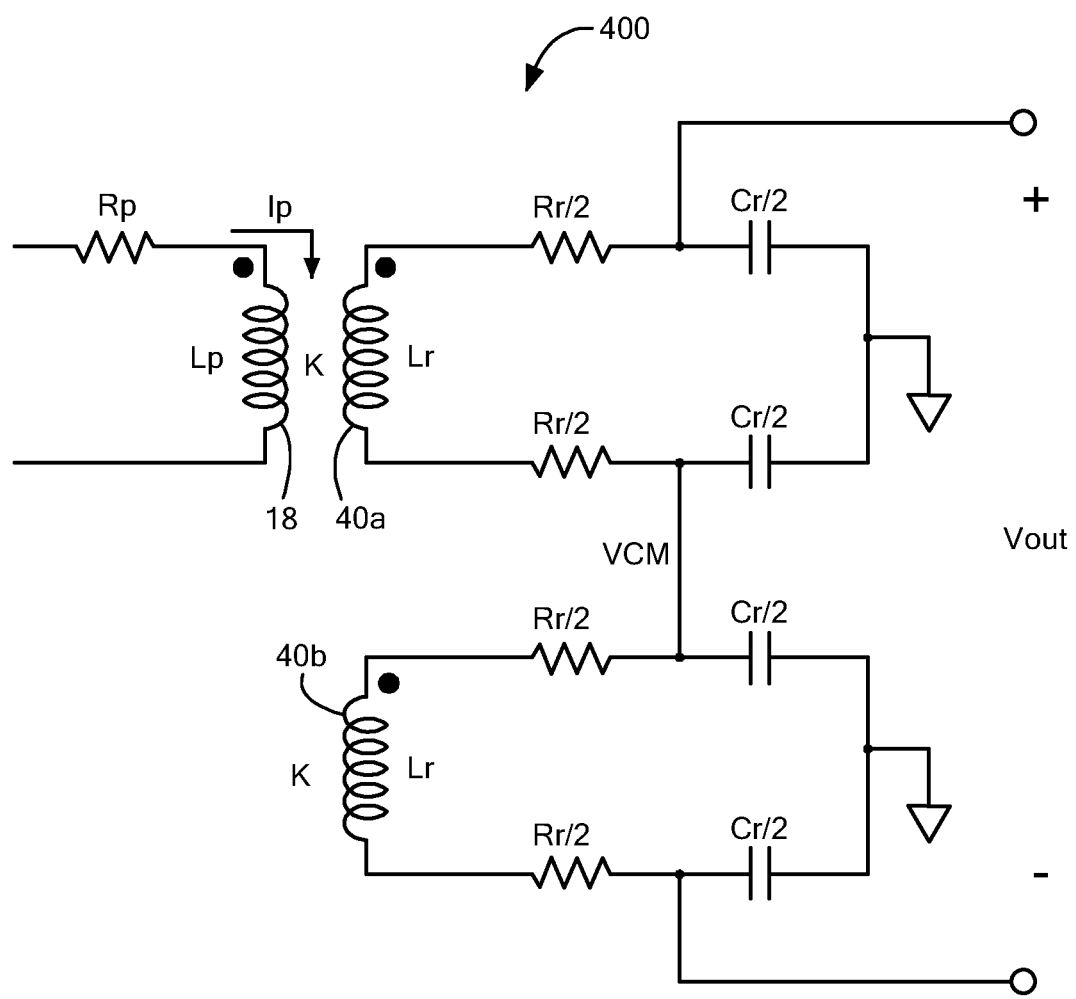
FIG. 4 illustrates an equivalent circuit of the current sensor lead frame and coils.

Referring to FIG. 4, an equivalent circuit 400 illustrates coils 40a, 40b and conductor 18. Specifically, conductor 18 is represented by a primary inductance Lp and a series primary resistance Rp. Each of coils 40a, 40b is represented by a respective inductance Lr, and series resistance Rr, and stray capacitance Cr, as shown. A common mode voltage reference, VCM, drives the node between the series resistance and stray capacitance associated with the coils, as shown. An output voltage Vout represents a series summation of the signals from the coils 40a, 40b.

In operation, a stray magnetic field on the coils 40a, 40b will be subtracted out in the output voltage Vout because the coils are exposed to the same magnetic field, thus creating identical voltages at their output terminals. While both output terminals will move magnetic field, they are connected to opposite inputs of a differential amplifier which has common mode feedback circuitry to remove the common mode signal.

Figure 4A:
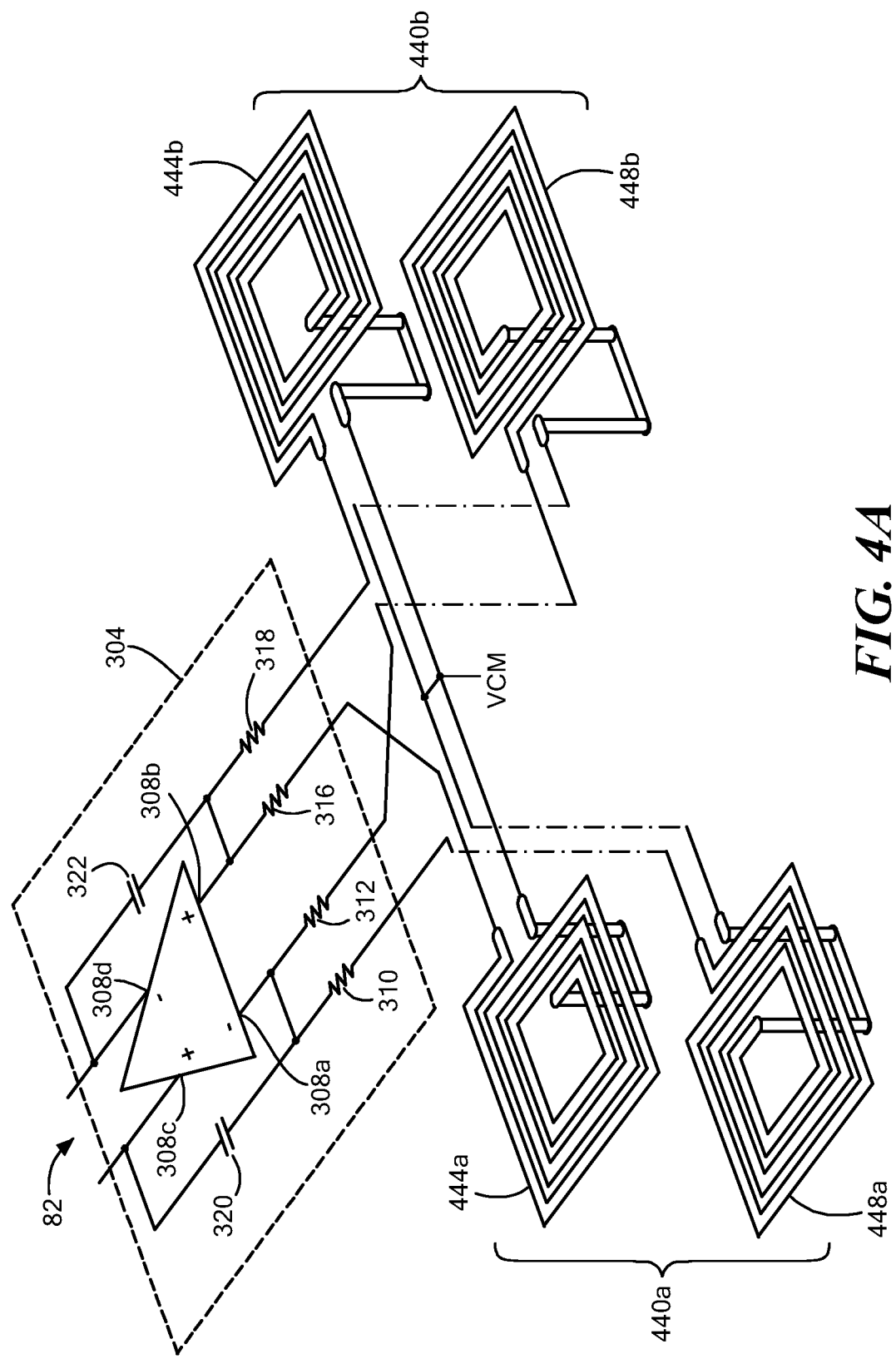
FIG. 4A illustrates an alternative coil winding arrangement coupled to the integrator of FIG. 2.

Referring also to FIG. 4A and according to a further aspect of the disclosure, an alternative coil configuration is shown in which coils 440a, 440b are formed in a "figure eight" pattern to minimize the common mode voltage variation. Coils 440a, 440b can be used in place of coils 40a, 40b and thus are shown coupled to integrator 304 (FIG. 3).

Each coil 440a, 440b is made up of two coils wound in opposite directions, with one such coil coupled to the inverting input 308a of the operational amplifier 308 and the other such coil coupled to the non-inverting input 308b of the operational amplifier 308. Thus, coils 440a, 440b are made up of four coils and, of the eight connections to these four coils, four connections go to the common mode node VCM and four go to integrator resistors 310, 312, 316, 318.

In the example embodiment, coil 440a includes coils 444a and 448a which coils are wound in opposite directions with respect to each other and coil 440b includes coils 444b and 448b which coils are wound in opposite directions with respect to each other. Specifically, coil 444a is wound in a counterclockwise direction and coil 448a is wound in a clockwise direction, with coil 444a coupled to the non-inverting input 308b of operational amplifier 308 and coil 448b coupled to the inverting input 308a of operational amplifier 308. Coil 444b is wound in a clockwise direction and coil 448b is wound in a counterclockwise direction, with coil 444b coupled to the non-inverting input 308b of operational amplifier 308 and coil 448b coupled to the inverting input 308a of operational amplifier 308, as shown.

With this arrangement, each of the coils 440a, 440b is split into two coils 444a, 448a and 444b, 448b that are wound in opposite directions with respect to each other and coupled to operational amplifier inputs of opposite polarity resulting in these signals of opposite polarity adding at the integrator input summing nodes. With this configuration, the mismatch in the coupling to the inside of the loop 14 coils and the outside of the loop 14 coils is corrected by creating an equal voltage signal to both of the inverting input 308a and non-inverting input 308b. This reduces the need for the reference VCM and the common-mode feedback of the operational amplifier 308 to correct for the mismatch.

It will be appreciated by those of ordinary skill in the art that while coils 444a, 444b are shown offset from each other and coils 448a, 448b are shown offset from each other in the perspective pictorial representation of FIG. 4A, in practice, turns of these coils can be vertically aligned.

Coils 440a, 440b with their respective constituent coils 444a, 448a and 444b, 448b can be constructed from multiple metal layers if the process has more the four levels of metal. For example, with a six-metal level process, the shield 46 (FIG. 1D) could be on metal layer 6, coils 444a, 444b on metal layers 4 and 5, and coils 448a, 448b on metals 2 and 3.

The illustrated configuration of coils 440a, 440b can reduce variation of the common mode voltage. This simplifies the common mode rejection requirements for the front end for a given magnetic field magnitude and frequency.

Figure 5:
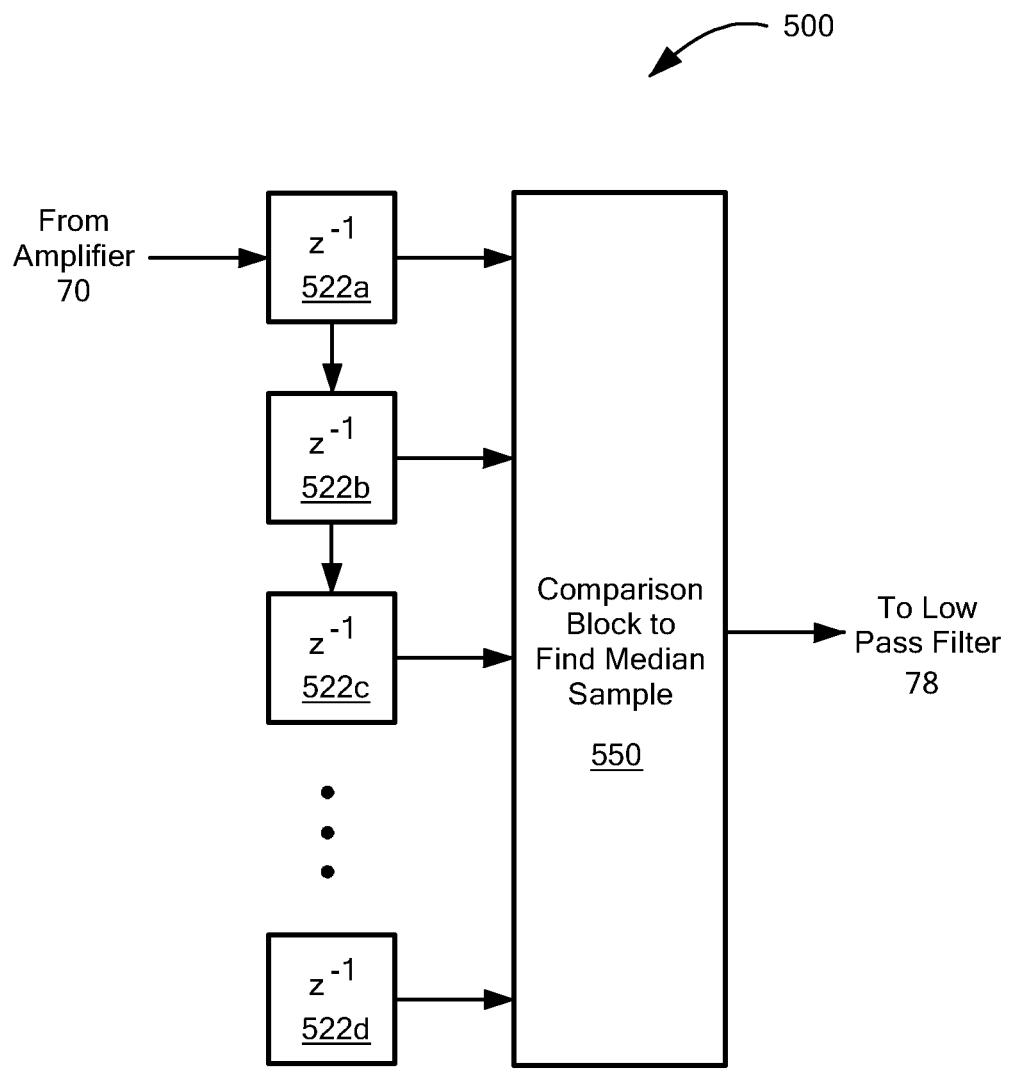
FIG. 5 shows an example dV/dt filter of the current sensor FIG. 2.
Figure 1:
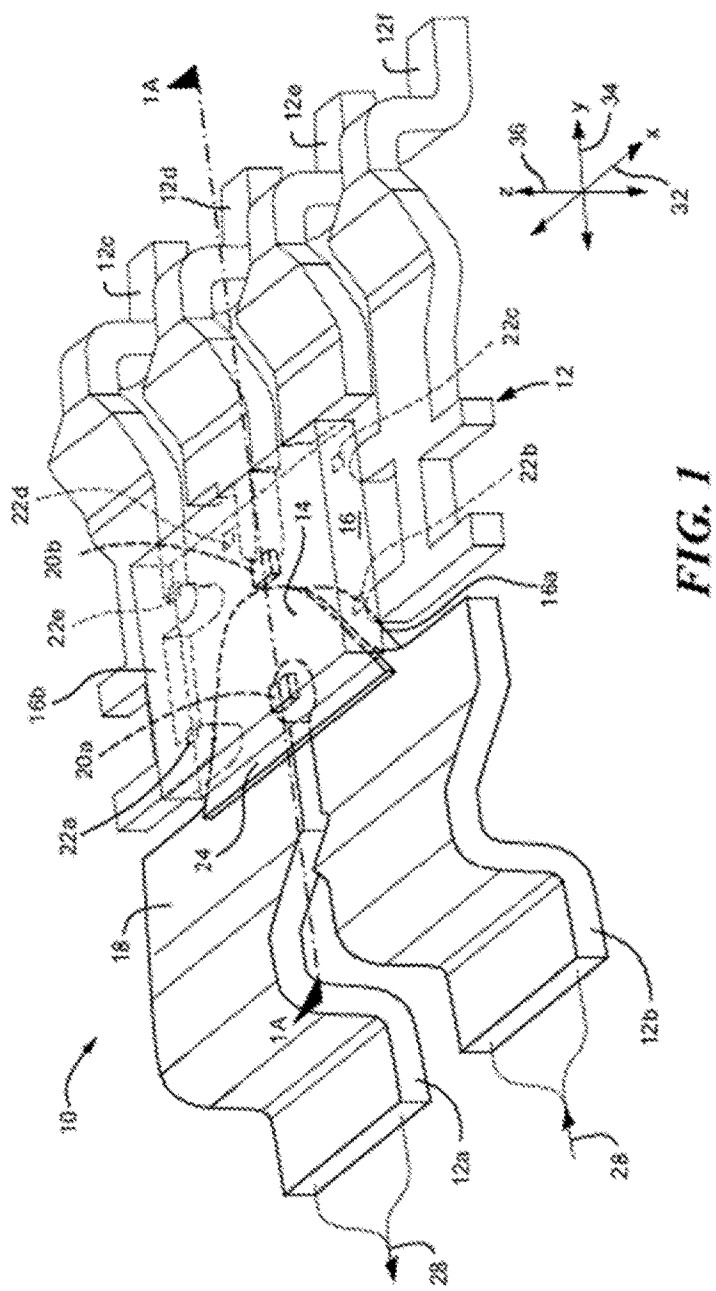
Figure 5:
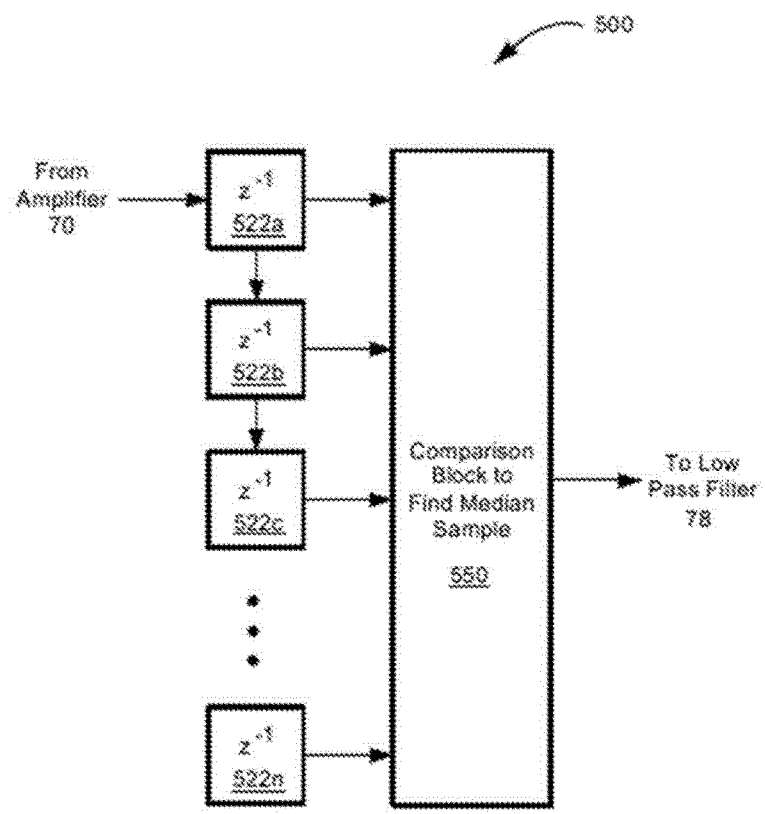

Referring also to FIG. 5, an example dV/dt filter 500 as can be used in the notch filter and dV/dt rejection circuit 76 of FIG. 2 includes a plurality of delay devices 522a-522n and filter 550. Filter 550 can be configured to reduce or eliminate errors due to voltage transients. For example, the output of amplifier 70 (FIG. 2) can be sampled and a current sample can be provided to first delay device 522a, which delay device 522a provides the previous sample to a second delay device 522b and each successive previous sample can be provided to delay devices 522c-522n respectively, as shown. An output of each of delay devices 522a-522n (that can be the same output that is provided to a subsequent delay device 522b-522n) can be provided to a respective input of filter 550. In an embodiment, filter 550 can be configured to generate a median sample based on each of the samples received.

Filter 550 can store multiple samples and generate the median sample value of the multiple samples to ignore a voltage transient event. In some embodiments, filter 550 can store an odd number of at least three previous samples and compute a median value of the stored previous samples. For example, filter 550 can store three or more odd number of samples and the median sample can be based on those samples. The three samples may be used to limit the effect of a single voltage transient event within the three samples. In other embodiments, other numbers of samples may be used to generate the median sample value. Filter 550 can provide the median sample, or the median value of the stored previous samples as an output signal to low pass filter 78 (FIG. 2).

All references cited herein are hereby incorporated herein by reference in their entirety.

Having described preferred embodiments, it will now become apparent to one of ordinary skill in the art that other embodiments incorporating their concepts may be used. Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

It is felt therefore that these embodiments should not be limited to disclosed embodiments, but rather should be limited only by the spirit and scope of the appended claims.

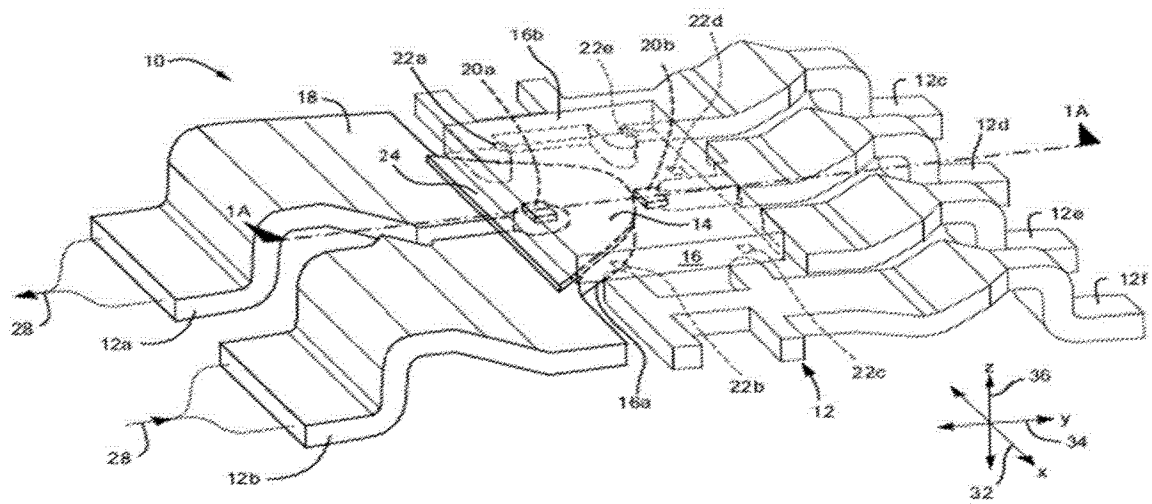

What is claimed is:

1. A current sensor comprising:
 a lead frame having a plurality of leads, at least two of the plurality of leads forming a current conductor configured to carry a current that generates a magnetic field;
 a substrate having first and second opposing surfaces, the first surface proximate to said current conductor and the second surface distal from the current conductor;
 a first magnetic field transducer disposed on the substrate;
 a first coil disposed on the substrate adjacent to the first magnetic field transducer, wherein the first magnetic field transducer and the first coil are positioned on a first side of the current conductor;
 a second magnetic field transducer disposed on the substrate; and
 a second coil disposed on the substrate adjacent to the second magnetic field transducer, wherein the second magnetic field transducer and the second coil are positioned on a second side of the current conductor.

2. The current sensor of claim 1, wherein the current conductor is curved and wherein the first side of the current conductor is inside the curve and wherein the second side of the current conductor is outside the curve.

3. The current sensor of claim 1, wherein the first coil is disposed concentrically with respect to the first magnetic field transducer and the second coil is disposed concentrically with respect to the second magnetic field transducer.

4. The current sensor of claim 1, wherein the first magnetic field transducer and the second magnetic field transducer are disposed on the first surface of the substrate.

5. The current sensor of claim 1, further comprising a shield disposed between the current conductor and the first and second coils, wherein the shield has at least one feature selected to reduce an eddy current induced in the shield.

6. The current sensor of claim 5, wherein the shield comprises at least one slot configured to reduce a path length of a closed loop current path in the shield.

7. The current sensor of claim 5, wherein the shield comprises a first shield and wherein the current sensor further comprises a second shield disposed between the first and second coils and the second surface of the substrate.

8. The current sensor of claim 1, wherein the first coil comprises third and fourth coils wound in opposite directions with respect to each other and the second coil comprises fifth and sixth coils wound in opposite directions with respect to each other.

9. The current sensor of claim 1, wherein the first magnetic field transducer and the second magnetic field transducer each comprise a Hall effect element.

10. The current sensor of claim 1, wherein the first magnetic field transducer is configured to generate a first magnetic field signal, the second magnetic field transducer is configured to generate a second magnetic field signal, the first coil is configured to generate a third magnetic field signal and the second coil is configured to generate a fourth magnetic field signal, and wherein the current sensor further comprises:
 a first signal path coupled to receive the first and second magnetic field signals and configured to generate a low frequency signal associated with a low frequency content of the current through the current conductor;
 a second signal path coupled to receive the third and fourth magnetic field signals and configured to generate a high frequency signal associated with a high frequency content of the current through the current conductor; and
 a summation circuit configured to sum the low frequency signal and the high frequency signal to provide a signal indicative of the current through the current conductor.

11. The current sensor of claim 10, wherein the first magnetic field transducer and the second magnetic field transducer detect the magnetic field in opposite directions, wherein the first coil and the second coil detect the magnetic field in opposite directions, wherein the low frequency signal is a differential signal generated by subtraction of the second magnetic field signal from the first magnetic field signal and wherein the high frequency signal is a differential signal generated by subtraction of the fourth magnetic field signal from the third magnetic field signal.

12. The current sensor of claim 10, wherein the first signal path comprises:
- a dV/dt filter responsive to the first and second magnetic field signals and configured to generate an impulse filtered signal; and
- a low pass filter coupled to receive the impulse filtered signal and configured to generate the low frequency signal.

13. The current sensor of claim 12, wherein the dV/dt filter comprises a median filter.

14. The current sensor of claim 10, wherein the second signal path comprises:
- an integrator coupled to receive the third and fourth magnetic field signals and comprising an amplifier; and
- an offset rejection circuit coupled in a feedback relationship between an output and an input of the amplifier, wherein the offset rejection circuit comprises a proportional-integral circuit configured to compensate for an offset of the amplifier.

15. The current sensor of claim 14, wherein the proportional-integral circuit comprises:
- an integrator stage comprising an integrating amplifier having a feedback capacitor and a first input resistor; and
- a proportional stage comprising an amplifier having a second input resistor and a feedback resistor, wherein a gain of the integrator is established by a capacitance of the feedback capacitor and an effective resistance of the first input resistor, the second input resistor, and the feedback resistor.

16. The current sensor of claim 15, wherein the first input resistor comprises a fixed resistor and wherein the current sensor further comprises a switched capacitor circuit in series with the fixed resistor, wherein the switched capacitor circuit comprises a plurality of switches and a capacitor.

17. The current sensor of claim 16, wherein the plurality of switches of the switched capacitor circuit are controlled during a startup period to decrease the effective resistance at the input of the integrating amplifier in order to thereby decrease the time constant of the integrator and wherein the plurality of switches of the switched capacitor circuit are controlled following the startup period to increase the effective resistance at the input of the integrating amplifier in order to thereby increase the time constant of the integrator.

18. The current sensor of claim 15, wherein the first input resistor comprises a fixed resistor and wherein the current sensor further comprises a MOSFET-C circuit in series with the fixed resistor, wherein the MOSFET-C circuit comprises a plurality of MOSFETs and one or more switches coupled in parallel with the plurality of MOSFETs.

19. The current sensor of claim 18, wherein the one or more switches of the MOSFET-C circuit are controlled during a startup period to decrease the effective resistance at the input of the integrating amplifier in order to thereby decrease the time constant of the integrator and wherein the one or more switches of the MOSFET-C circuit are controlled following the startup period to increase the effective resistance at the input of the integrating amplifier in order to thereby increase the time constant of the integrator.

20. The current sensor of claim 1, further comprising an integrated circuit package configured to enclose the substrate and at least a portion of the plurality of leads of the lead frame.

21. A current sensor comprising:
- a lead frame having a plurality of leads, at least two of the plurality of leads forming a current conductor configured to carry a current that generates a magnetic field;
- a substrate having first and second opposing surfaces, the first surface proximate to said current conductor and the second surface distal from the current conductor;
- a first magnetic field transducer disposed on the substrate and configured to generate a first magnetic field signal;
- a first coil disposed on the substrate concentrically with respect to the first magnetic field transducer and configured to generate a second magnetic field signal;
- a first signal path coupled to receive the first magnetic field signal and configured to generate a low frequency signal associated with a low frequency content of the current through the current conductor;
- a second signal path coupled to receive the second magnetic field signal and configured to generate a high frequency signal associated with a high frequency content of the current through the current conductor; and
- a summation circuit configured to sum the low frequency signal and the high frequency signal to provide a signal indicative of the current through the current conductor.

22. A current sensor comprising:
- a lead frame having a plurality of leads, at least two of the plurality of leads forming a current conductor configured to carry a current that generates a magnetic field;
- a substrate having first and second opposing surfaces, the first surface proximate to said current conductor and the second surface distal from the current conductor;
- a first magnetic field transducer disposed on the substrate;
- a first coil disposed on the substrate adjacent to the first magnetic field transducer;
- a second magnetic field transducer disposed on the substrate; and
- a second coil disposed on the substrate adjacent to the second magnetic field transducer, wherein the first coil comprises third and fourth coils wound in opposite directions with respect to each other and the second coil comprises fifth and sixth coils wound in opposite directions with respect to each other.

23. A current sensor comprising:
- a lead frame having a plurality of leads, at least two of the plurality of leads forming a current conductor configured to carry a current that generates a magnetic field;
- a substrate having first and second opposing surfaces, the first surface proximate to said current conductor and the second surface distal from the current conductor;
- a first magnetic field transducer disposed on the substrate and configured to generate a first magnetic field signal;
- a first coil disposed on the substrate and configured to generate a second magnetic field signal;
- a first signal path coupled to receive the first magnetic field signal and configured to generate a low frequency signal associated with a low frequency content of the current through the current conductor, wherein the first signal path comprises a dV/dt filter coupled to receive the first magnetic field signal and configured to generate an impulse filtered signal;

a second signal path coupled to receive the second magnetic field signal and configured to generate a high frequency signal associated with a high frequency content of the current through the current conductor; and
a summation circuit configured to sum the low frequency signal and the high frequency signal to provide a signal indicative of the current through the current conductor.

24. A current sensor integrated circuit comprising:
a lead frame having a plurality of leads, at least two of the plurality of leads forming a current conductor configured to carry a current that generates a magnetic field;
a substrate having first and second opposing surfaces, the first surface proximate to said current conductor and the second surface distal from the current conductor;
a first magnetic field transducer disposed on the substrate and configured to generate a first magnetic field signal;
a first coil disposed on the substrate and configured to generate a second magnetic field signal;
a first signal path coupled to receive the first magnetic field signal and configured to generate a low frequency signal associated with a low frequency content of the current through the current conductor;
a second signal path coupled to receive the second magnetic field signal and configured to generate a high frequency signal associated with a high frequency content of the current through the current conductor, wherein the second signal path comprises an integrator coupled to receive the second magnetic field signal and comprising an amplifier and an offset rejection circuit coupled in a feedback relationship between an output and an input of the amplifier, wherein the offset rejection circuit comprises a proportional-integral circuit configured to compensate for an offset of the amplifier, wherein the proportional-integral circuit comprises:
an integrator stage comprising an integrating amplifier having a feedback capacitor and a first input resistor; and
a proportional stage comprising an amplifier having a second input resistor and a feedback resistor, wherein a gain of the integrator is established by a capacitance of the feedback capacitor and an effective resistance of the first input resistor, the second input resistor, and the feedback resistor; and
a summation circuit configured to sum the low frequency signal and the high frequency signal to provide a signal indicative of the current through the current conductor.

25. The current sensor of claim 24, wherein the first input resistor comprises a fixed resistor and a MOSFET-C circuit comprising a plurality of MOSFETs and one or more switches coupled in parallel with the plurality of MOSFETs.

26. The current sensor of claim 25, wherein the one or more switches of the MOSFET-C circuit are controlled during a startup period to decrease the effective resistance of the first input resistor in order to thereby decrease the time constant of the integrator and wherein the one or more switches of the MOSFET-C circuit are controlled following the startup period to increase the effective resistance of the first input resistor in order to thereby increase the time constant of the integrator.

* * * * *

UNITED STATES PATENT AND TRADEMARK OFFICE
CERTIFICATE OF CORRECTION

| | |
|---|---|
| PATENT NO. | : 11,366,141 B1 |
| APPLICATION NO. | : 17/160573 |
| DATED | : June 21, 2022 |
| INVENTOR(S) | : Steven Daubert et al. |

It is certified that error appears in the above-identified patent and that said Letters Patent is hereby corrected as shown below:

On the Title Page

Delete the title page and substitute with the attached title page consisting of the corrected illustrative figure(s).

In the Drawings

Please replace drawing sheets 1 of 13 and 13 of 13 with replacement drawing sheets 1 of 13 and 13 of 13 attached hereto.

In the Specification

Column 5, Lines 61-62 delete "sensor FIG. 2" and replace with --sensor of FIG. 2--.

Column 6, Lines 31-32 delete "here to say that" and replace with --here that--.

Column 7, Line 30 delete "coincides the" and replace with --coincides with the--.

Column 8, Line 42 delete "positioning the" and replace with --positioning of the--.

Column 8, Line 66 delete "relative the" and replace with --relative to the--.

Column 10, Line 36 delete "lead" and replace with --leads--.

Column 11, Lines 43-44 delete "coil path 52" and replace with --signal path 52--.

Column 12, Line 3 delete "coil path 52" and replace with --signal path 52--.

Column 12, Line 38 delete "monitoring 12d" and replace with --monitoring lead 12d--.

Signed and Sealed this
Nineteenth Day of March, 2024

Katherine Kelly Vidal
*Director of the United States Patent and Trademark Office*

CERTIFICATE OF CORRECTION (continued)
U.S. Pat. No. 11,366,141 B1

Column 13, Line 11 delete "in same" and replace with --in the same--.

Column 13, Line 24 delete "resistor" and replace with --resistors--.

Column 13, Line 27 delete "field" and replace with --fields--.

Column 13, Line 59 delete "art other" and replace with --art that other--.

Column 14, Line 63 delete "380" and replace with --360--.

Column 15, Line 8 delete ". Proportional" and replace with --. Operational--.

Column 15, Line 12 delete "operate" and replace with --operates--.

Column 15, Line 42 delete "of a fixed" and replace with --of fixed--.

Column 15, Line 48 delete ". Proportional amplifier 384 has a" and replace with --. Operational amplifier 384 has--.

Column 16, Line 7 delete "resistor" and replace with --resistors--.

Column 16, Line 10 delete "resistor" and replace with --resistors--.

Column 16, Line 18 delete "Rr," and replace with --Rr/2--.

Column 16, Line 19 delete "Cr," and replace with --Cr/2--.

Column 16, Line 66 delete "loop 14" and replace with --loop--.

Column 16, Line 67 delete "loop 14" and replace with --loop--.

Column 17, Line 12 delete "more the" and replace with --more than the--.

Column 17, Line 15 delete "metals 2 and" and replace with --metal layers 2 and--.

(12) United States Patent
Daubert et al.

(10) Patent No.: US 11,366,141 B1
(45) Date of Patent: Jun. 21, 2022

(54) MULTIPATH WIDE BANDWIDTH CURRENT SENSOR

(71) Applicant: Allegro MicroSystems, LLC, Manchester, NH (US)

(72) Inventors: Steven Daubert, Bedford, NH (US); Sina Haji Alizad, Manchester, NH (US); Srujan Shivanakere, Nashua, NH (US); Maxwell McNally, Manchester, NH (US); Alexander Latham, Harvard, MA (US)

(73) Assignee: Allegro MicroSystems, LLC, Manchester, NH (US)

( * ) Notice: Subject to any disclaimer, the term of this patent is extended or adjusted under 35 U.S.C. 154(b) by 1 day.

(21) Appl. No.: 17/160,573

(22) Filed: Jan. 28, 2021

(51) Int. Cl.
*G01R 19/14* (2006.01)
*G01R 19/25* (2006.01)

(52) U.S. Cl.
CPC .............. *G01R 19/14* (2013.01); *G01R 19/25* (2013.01)

(58) Field of Classification Search
None
See application file for complete search history.

(56) References Cited

U.S. PATENT DOCUMENTS

| | | | |
|---|---|---|---|
| 7,598,601 B2 * | 10/2009 | Taylor | H01L 24/37 257/E27.005 |
| 7,768,083 B2 | 8/2010 | Doogue et al. | |
| 8,629,520 B2 | 1/2014 | Doogue et al. | |
| 8,952,471 B2 | 2/2015 | Doogue et al. | |
| 9,082,957 B2 | 7/2015 | Doogue et al. | |
| 9,859,489 B2 | 1/2018 | Doogue et al. | |
| 10,069,063 B2 | 9/2018 | Doogue et al. | |
| 10,145,908 B2 | 12/2018 | David et al. | |
| 10,352,969 B2 | 7/2019 | Milano et al. | |
| 10,670,672 B2 | 6/2020 | David et al. | |
| 10,935,612 B2 | 3/2021 | Belin et al. | |
| 2020/0249286 A1 | 8/2020 | David et al. | |
| 2021/0376227 A1 * | 12/2021 | Latham | G01R 19/0092 |
| 2022/0026469 A1 * | 1/2022 | Schmitt | G01R 33/0017 |

OTHER PUBLICATIONS

U.S. Appl. No. 17/120,395, filed Dec. 14, 2020, Casu et al.

(Continued)

*Primary Examiner* — Daniel C Puentes
(74) *Attorney, Agent, or Firm* — Daly, Crowley, Mofford & Durkee, LLP

(57) ABSTRACT

A current sensor includes a lead frame having a plurality of leads, at least two of which form a current conductor configured to carry a current that generates a magnetic field and a substrate having first and second opposing surfaces, the first surface proximate to said current conductor and the second surface distal from the current conductor. A first magnetic field transducer is disposed on the substrate and a first coil is disposed on the substrate adjacent to the first magnetic field transducer, wherein the first magnetic field transducer and the first coil are positioned on a first side of the current conductor. A second magnetic field transducer is disposed on the substrate and a second coil is disposed on the substrate adjacent to the second magnetic field transducer, wherein the second magnetic field transducer and the second coil are positioned on a second side of the current conductor.

26 Claims, 13 Drawing Sheets